(12) United States Patent
Kobayashi et al.

(10) Patent No.: US 8,373,281 B2
(45) Date of Patent: Feb. 12, 2013

(54) SEMICONDUCTOR MODULE AND PORTABLE APPARATUS PROVIDED WITH SEMICONDUCTOR MODULE

(75) Inventors: Hajime Kobayashi, Kumagaya (JP); Mayumi Nakasato, Ogaki (JP); Ryosuke Usui, Ichinomiya (JP); Yasuyuki Yanase, Gifu (JP); Koichi Saito, Ogaki (JP)

(73) Assignee: Sanyo Electric Co., Ltd.

( * ) Notice: Subject to any disclaimer, the term of this patent is extended or adjusted under 35 U.S.C. 154(b) by 108 days.

(21) Appl. No.: 13/056,851

(22) PCT Filed: Jul. 29, 2009

(86) PCT No.: PCT/JP2009/003598
§ 371 (c)(1),
(2), (4) Date: Apr. 25, 2011

(87) PCT Pub. No.: WO2010/013470
PCT Pub. Date: Feb. 4, 2010

(65) Prior Publication Data
US 2011/0186993 A1    Aug. 4, 2011

(30) Foreign Application Priority Data

Jul. 31, 2008 (JP) .................................. 2008-199072
Sep. 30, 2008 (JP) .................................. 2008-255795

(51) Int. Cl.
*H01L 23/52* (2006.01)
*H01L 23/48* (2006.01)
*H01L 29/40* (2006.01)

(52) U.S. Cl. ................ 257/781; 257/E23.069; 257/737; 257/787; 438/614; 438/617

(58) Field of Classification Search ........... 257/E23.021, 257/E23.069, 666, 668, 678, 690, 737, 734, 257/738, 773, 779–781, 783, 784, 787; 438/612, 438/614, 617, 666; 174/258, 260, 262; 361/760
See application file for complete search history.

(56) References Cited

U.S. PATENT DOCUMENTS
(Continued)

FOREIGN PATENT DOCUMENTS
JP      7-050383       2/1995
JP      2003-007904    1/2003
(Continued)

OTHER PUBLICATIONS

International Search Report issued in International Patent Application No. PCT/JP2009/003598, dated Aug. 25, 2009.
(Continued)

*Primary Examiner* — Chris Chu
(74) *Attorney, Agent, or Firm* — McDermott Will & Emery LLP

(57) ABSTRACT

A semiconductor element mounted on an insulating resin layer formed on a wiring layer is sealed by a sealing resin. On the wiring layer, a protruding electrode protruding to the side of the semiconductor element and a protruding section are integrally formed with the wiring layer, respectively. The protruding electrode is electrically connected to an element electrode of the semiconductor element by penetrating the insulating resin layer. The protruding section is arranged to surround the semiconductor element along the four sides of the semiconductor element, and is embedded in the sealing resin up to a position above a section where the protruding electrode and the element electrode are bonded.

13 Claims, 29 Drawing Sheets

U.S. PATENT DOCUMENTS

| | | | |
|---|---|---|---|
| 6,071,755 A * | 6/2000 | Baba et al. | 438/106 |
| 6,830,956 B2 * | 12/2004 | Masumoto et al. | 438/108 |
| 7,573,141 B2 * | 8/2009 | Lopez | 257/783 |
| 7,656,046 B2 * | 2/2010 | Kurita et al. | 257/787 |
| 7,872,347 B2 * | 1/2011 | Kaufmann | 257/700 |
| 7,944,039 B2 * | 5/2011 | Arai | 257/690 |
| 7,952,210 B2 * | 5/2011 | Jung et al. | 257/781 |
| 8,018,043 B2 * | 9/2011 | Suh et al. | 257/690 |
| 2003/0011069 A1 * | 1/2003 | Shibata | 257/734 |
| 2005/0252682 A1 * | 11/2005 | Shimoto et al. | 174/260 |
| 2006/0138674 A1 * | 6/2006 | Huang et al. | 257/779 |
| 2006/0231950 A1 * | 10/2006 | Yoon | 257/737 |

FOREIGN PATENT DOCUMENTS

| | | |
|---|---|---|
| JP | 2005-340862 | 12/2005 |
| JP | 2008-060587 | 3/2008 |

OTHER PUBLICATIONS

International Preliminary Report on Patentability and Written Opinion of the International Searching Authority, with English translations, issued in International Patent Application No. PCT/JP2009/003598, dated Feb. 1, 2011 and Mar. 8, 2011.

* cited by examiner

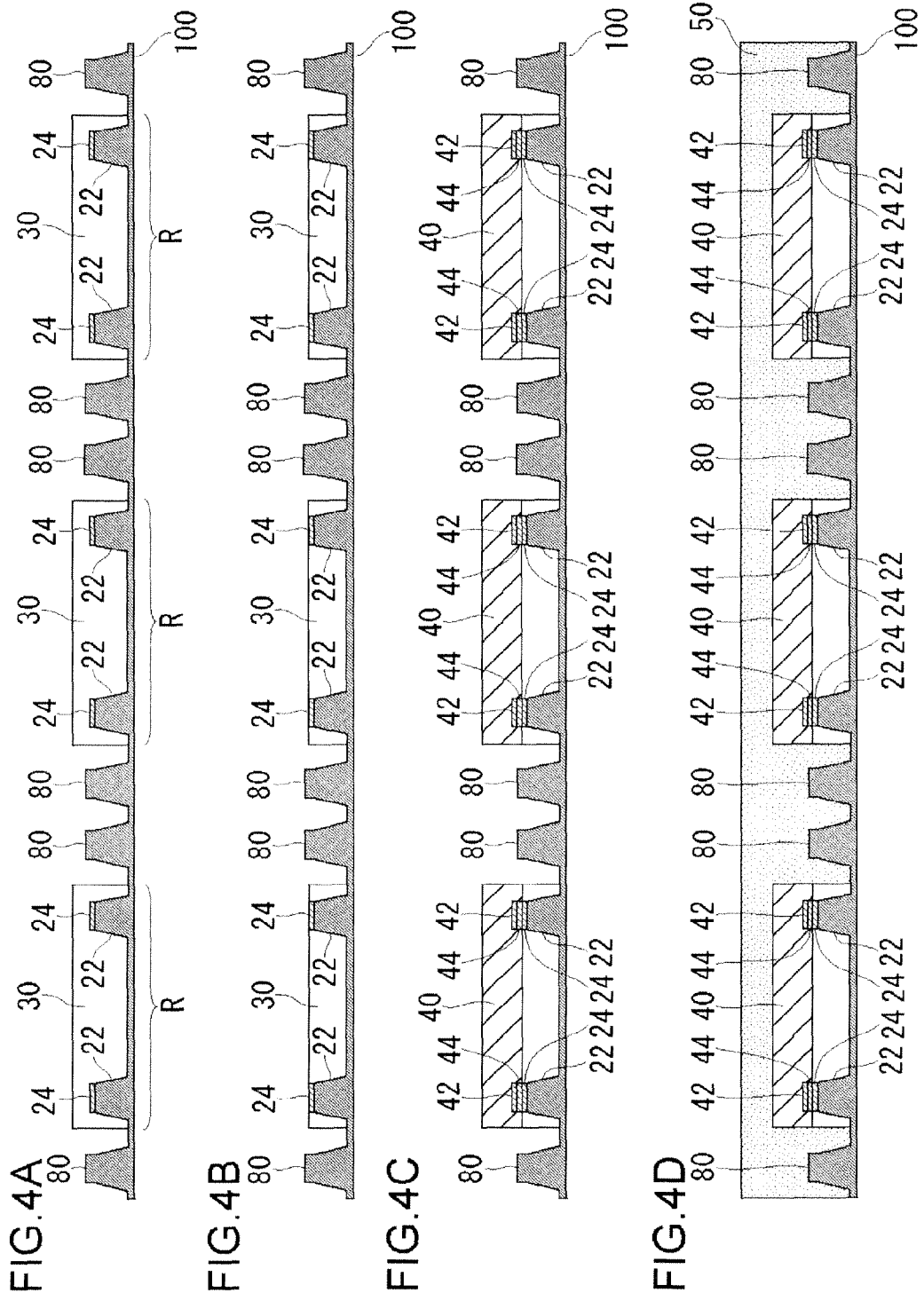

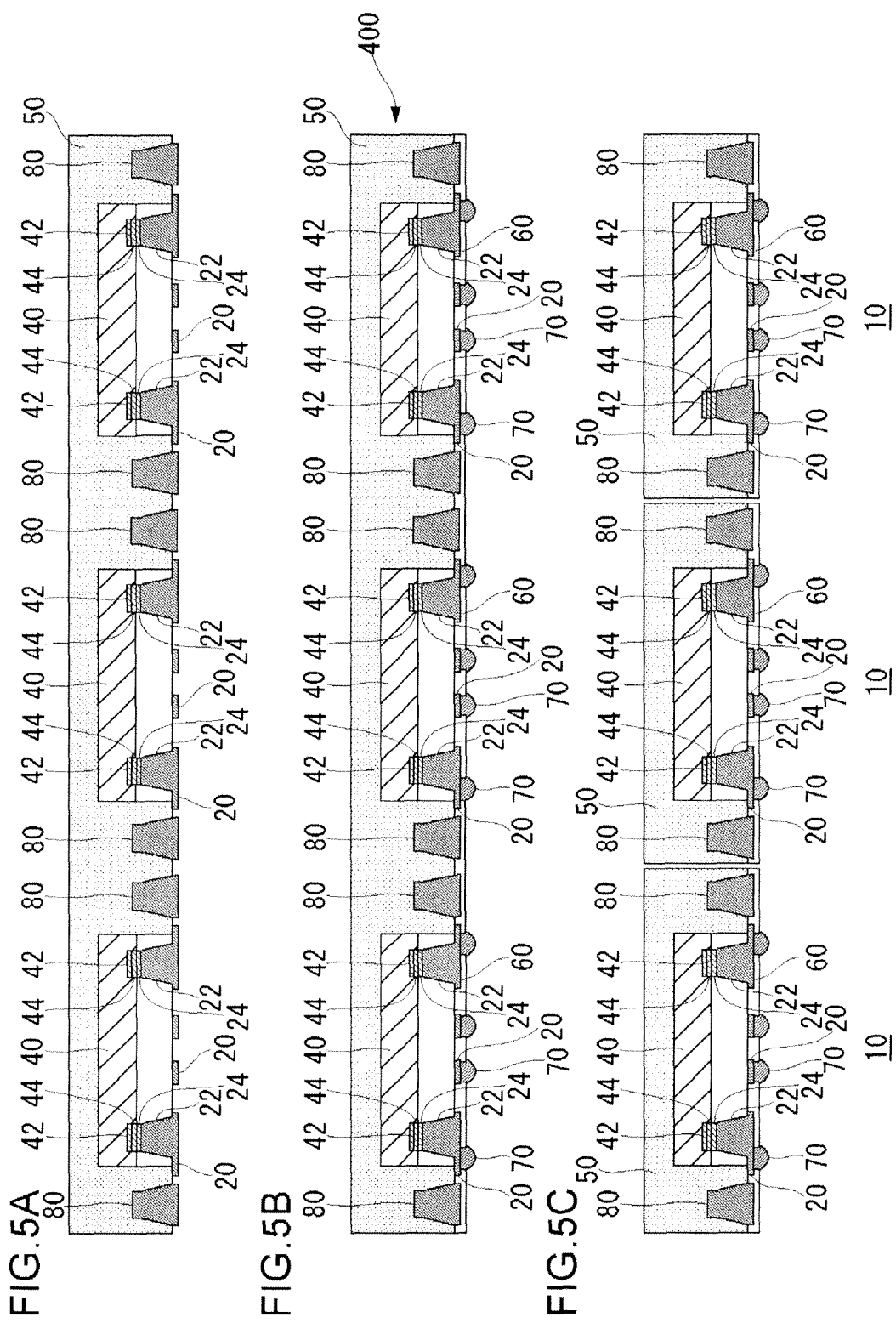

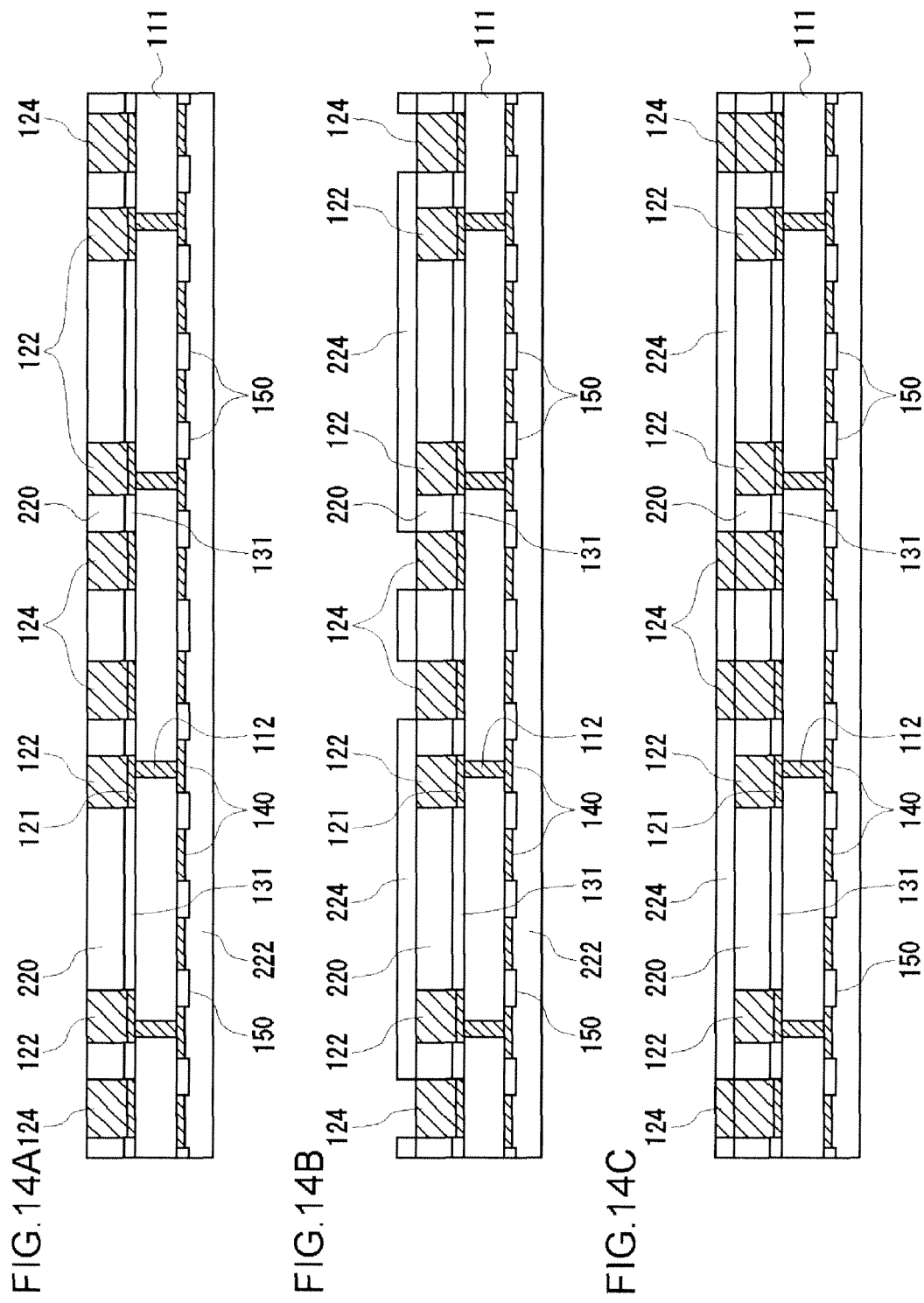

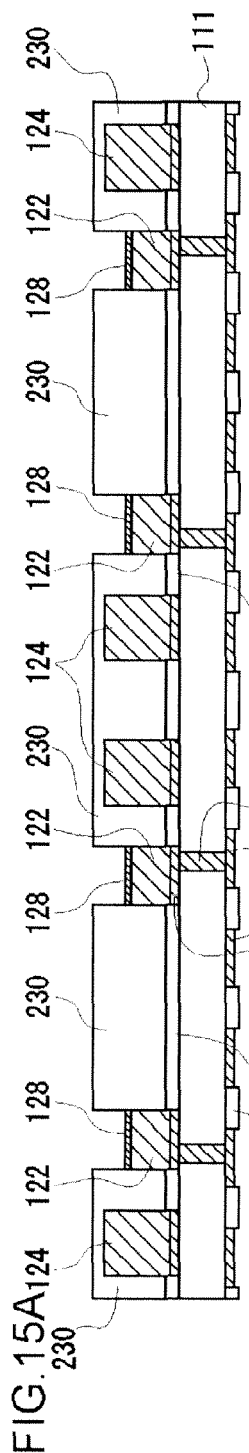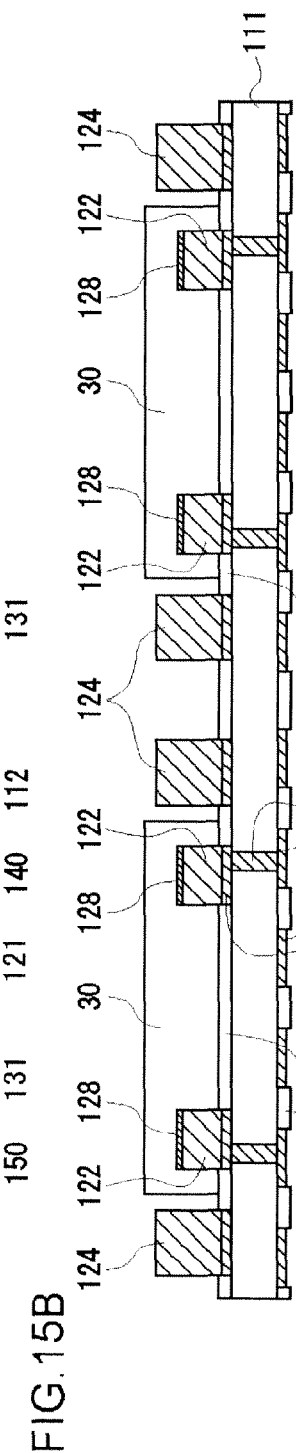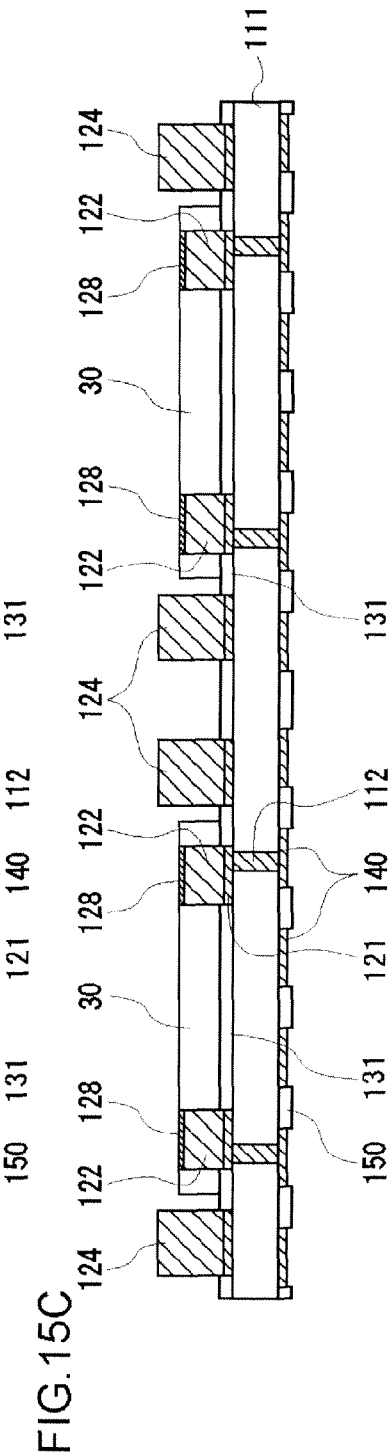

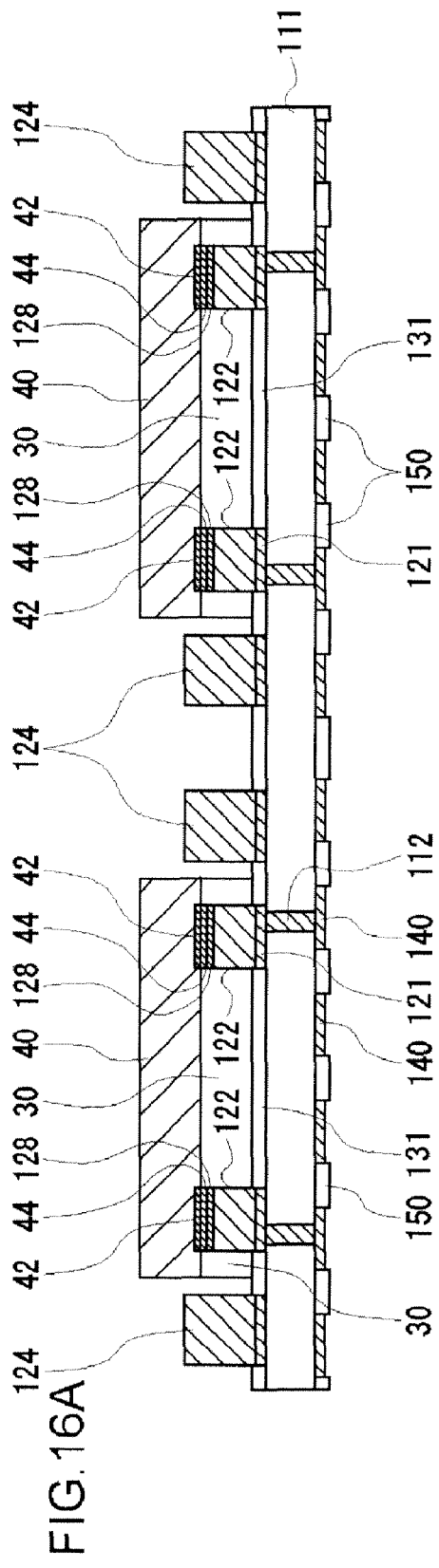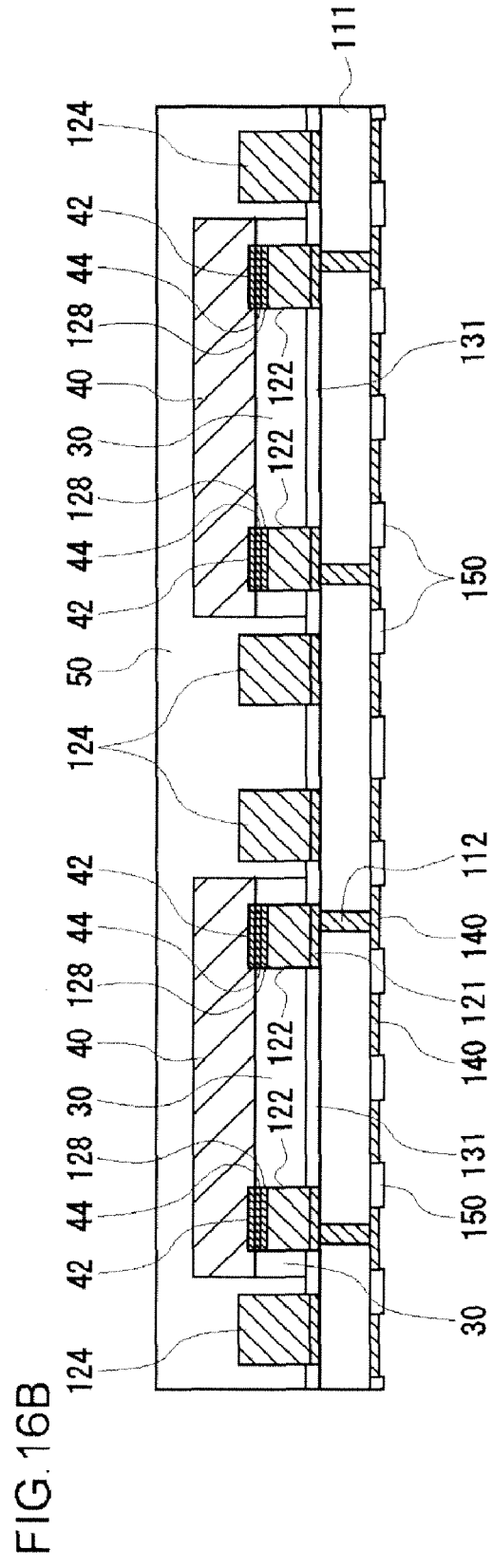

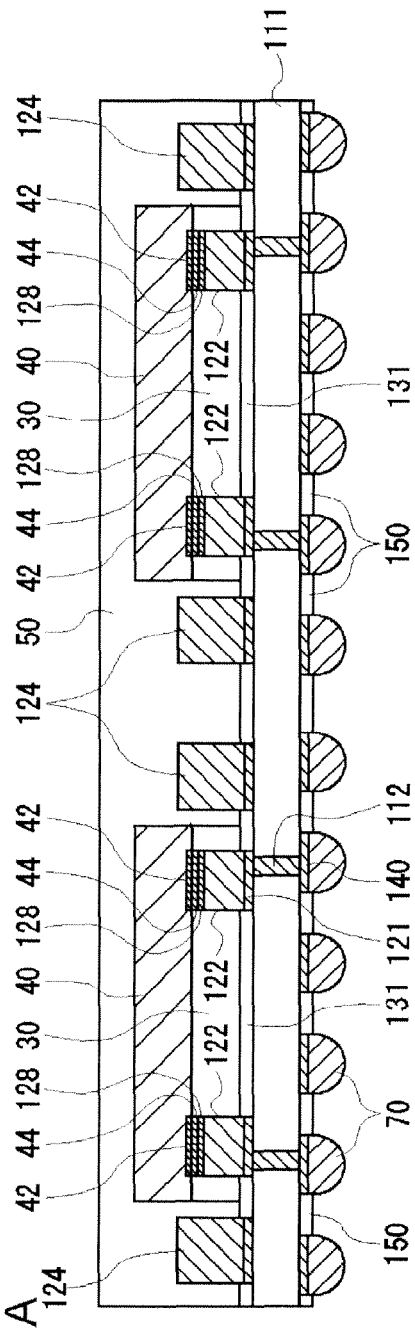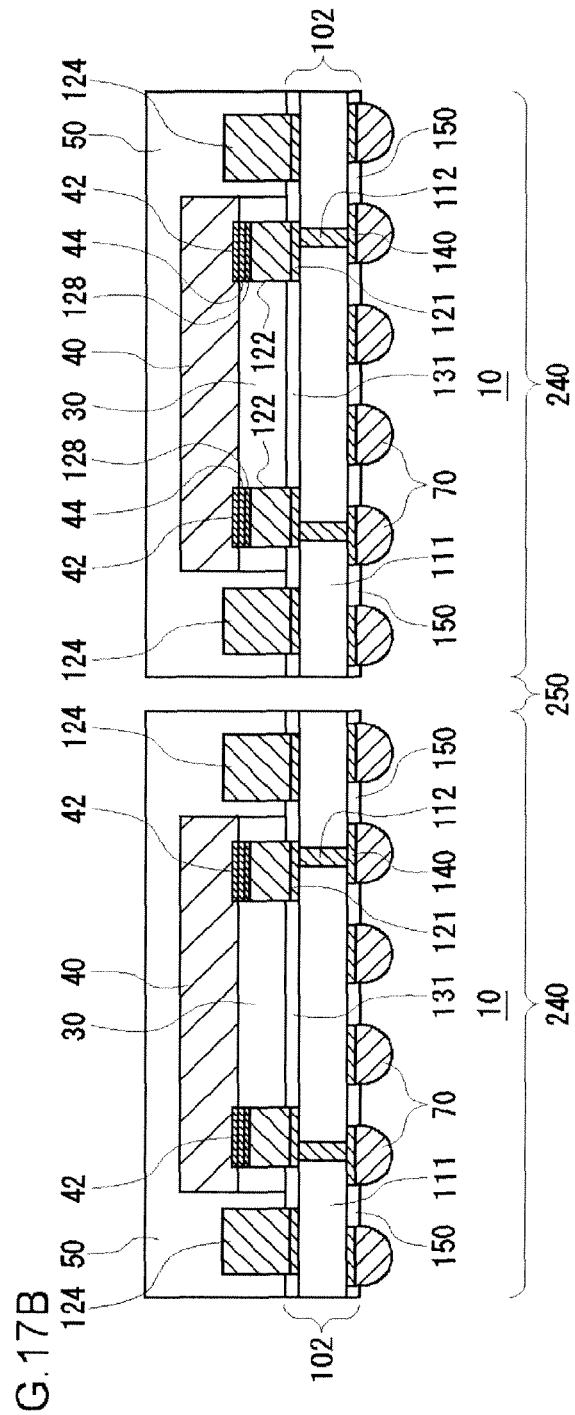

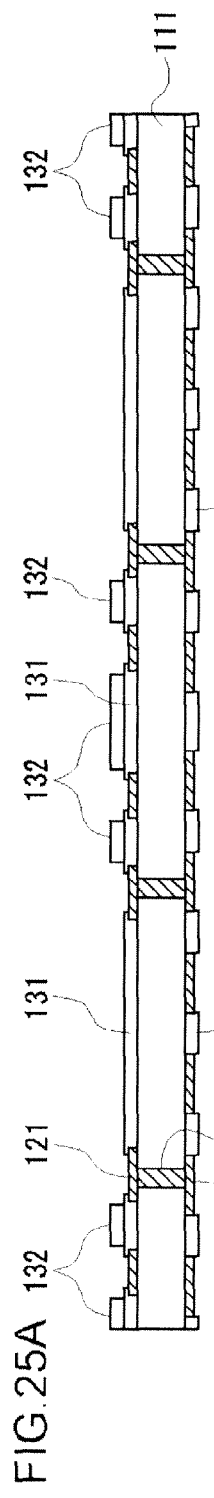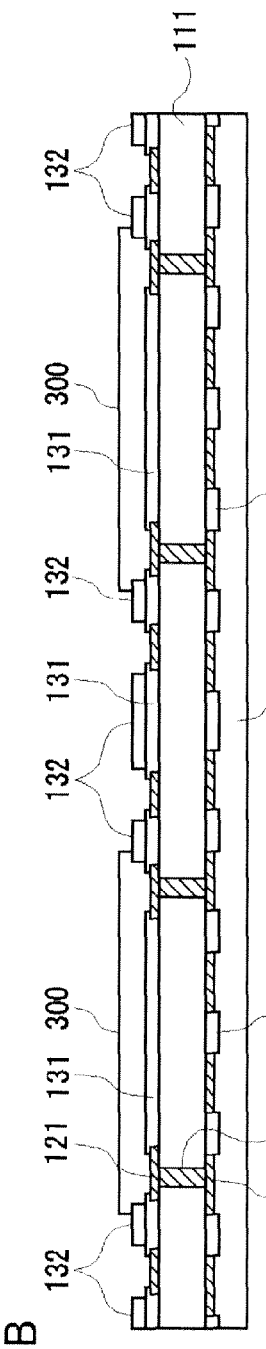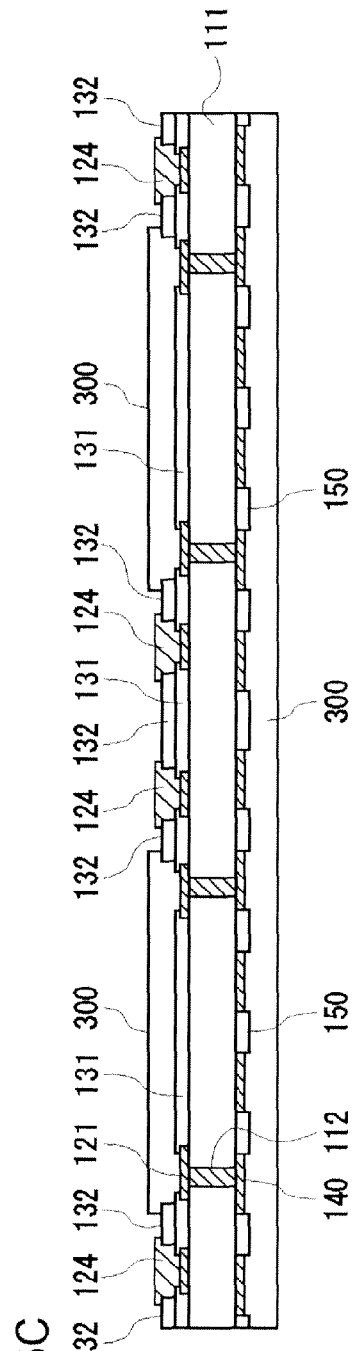

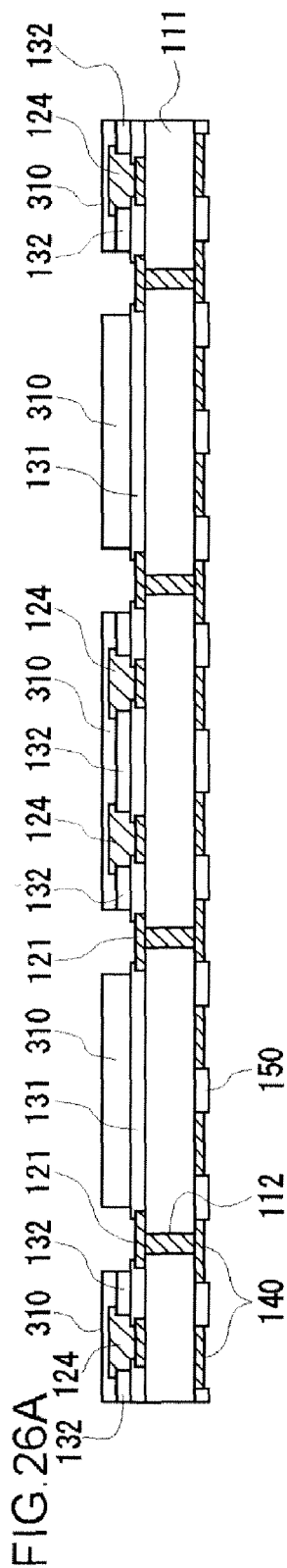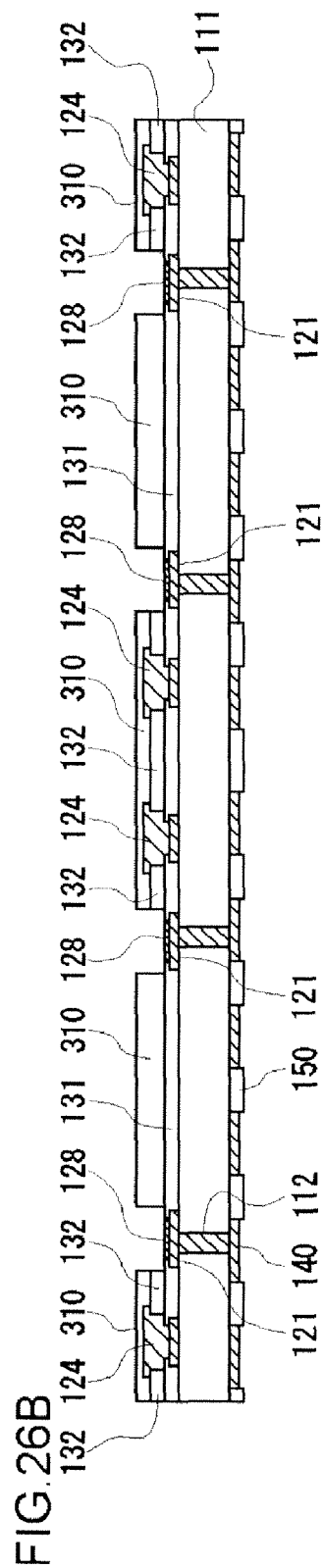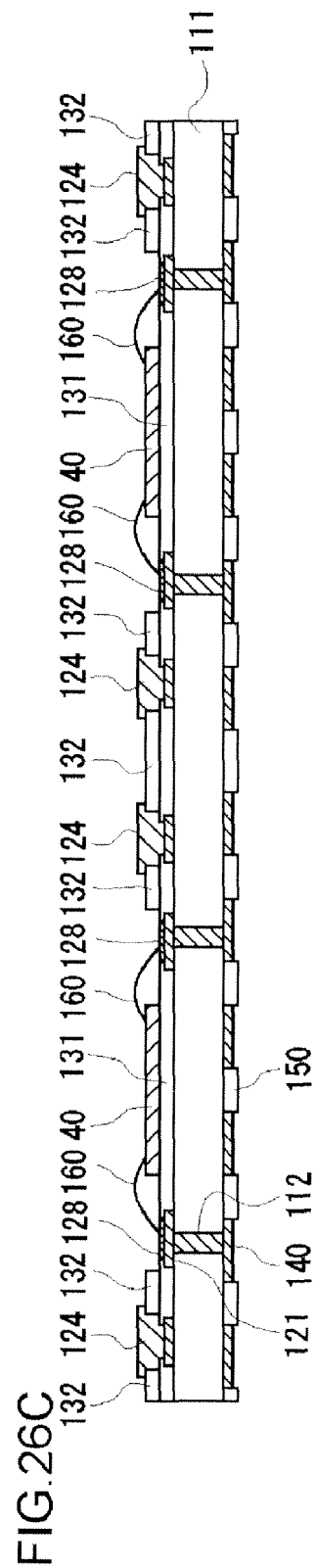

SEMICONDUCTOR MODULE AND PORTABLE APPARATUS PROVIDED WITH SEMICONDUCTOR MODULE

RELATED APPLICATIONS

This application is the U.S. National Phase under 35 U.S.C. §371 of International Application No. PCT/JP2009/003598, filed on Jul. 29, 2009, which in turn claims the benefit of Japanese Application No. 2008-199072, filed on Jul. 31, 2008 and Japanese Application No. 2008-255795, filed on Sep. 30, 2008, the disclosures of which Applications are incorporated by reference herein.

TECHNICAL FIELD

The present invention relates to a semiconductor module packaged with a sealing resin and a mobile apparatus equipped with the semiconductor module.

BACKGROUND TECHNOLOGY

Portable electronic devices, such as mobile phones, PDAs, DVCs and DSCs, are gaining increasing sophistication in functions and features. And to be accepted by the market, they have to be smaller in size and lighter in weight, and for the realization thereof, there is a growing demand for highly-integrated system LSIs. On the other hand, these electronic devices are desired to be easier or handier to use, and therefore the LSIs used in those devices are required to be more functionally sophisticated and better performing. For this reason, the higher integration of LSI chips is causing increases in I/O count (the number of inputs/outputs), which in turn generates demand for smaller packages. To satisfy both these requirements, it is strongly desired that semiconductor packages suited for the high board density packaging of semiconductor components be developed. To meet such needs, a variety of packaging technologies called CSP (Chip Size Package) are being developed.

Patent Document 1 discloses a semiconductor module where a semiconductor chip is mounted on an interposer board and this semiconductor is sealed by a sealing resin.

RELATED ART DOCUMENTS

Patent Documents

[Patent Document 1] Japanese Unexamined Patent Publication No. 2008-60587.

DISCLOSURE OF THE INVENTION

Problems to be Solved by the Invention

In the conventional semiconductor module packaged with the sealing resin, water easily reaches the mounting region of the semiconductor device when the water enters through a space between the sealing resin and a substrate. This may lead to a reduction in connection strength of the semiconductor device and may eventually lead to a reduction in operation reliability of the semiconductor module.

The present invention has been made in view of the foregoing problems to be resolved, and a purpose thereof is to provide a technology for suppressing the infiltration of water into the semiconductor module packaged with a sealing resin.

Means for Solving the Problems

One embodiment according to the present invention relates to a semiconductor module. The semiconductor module comprises: a wiring layer of a predetermined pattern; a semiconductor device mounted on the wiring layer with an insulating resin layer disposed between the semiconductor device and the wiring layer, the semiconductor device having a device electrode disposed counter to the wiring layer; a bump electrode, penetrating the insulating resin layer, connected to the device element wherein the bump electrode protrudes on a side of the semiconductor device from the wiring layer; a sealing resin for sealing the semiconductor device; and a bump disposed along at least one side of the semiconductor device wherein the bump protrudes on a side of the semiconductor device from the wiring layer and is embedded in the sealing resin.

By employing this embodiment, when water enters from the outside, the bump embedded in the sealing resin from a wiring layer side plays a role of barrier against the infiltration of water, thereby preventing water from further entering a region on a semiconductor device side. Thus, the operation reliability of the semiconductor module is improved.

Another embodiment according to the present invention relates to a semiconductor module. The semiconductor module comprises: a substrate; a wiring layer provided on one main surface of the substrate; a semiconductor device mounted on the substrate with an insulating resin layer disposed between the semiconductor device and the substrate, the semiconductor device having a device electrode disposed counter to the wiring layer; a substrate electrode provided on the wiring layer, the substrate electrode being electrically connected to the device electrode; a sealing resin for sealing the semiconductor device; and a bump disposed along at least one side of said semiconductor device wherein the bump protrudes on a side of the semiconductor device from the wiring layer and is embedded in the sealing resin.

By employing this embodiment, when water enters from the outside, the bump embedded in the sealing resin from a substrate side plays a role of barrier against the infiltration of water, thereby preventing water from further entering a region on a semiconductor device side. Thus, the operation reliability of the semiconductor module is improved.

In the semiconductor module according to the above-described embodiment, a head portion of the bump may be located above a joint between the substrate electrode and the device electrode. Also, the bump may be provided along each side of the semiconductor device. Also, the substrate electrode may protrude on a side of said semiconductor device and may be a bump electrode which penetrates the insulating resin layer and connects to the device electrode. In such a case, the bump and the substrate electrode are formed of the same material. Also, the bump electrode and the wiring layer may be integrally formed with each other.

In the above-described embodiment, the semiconductor module may further comprise a metallic foil covering the sealing resin, and the metallic foil may be electrically connected to a part of the bump fixed to a ground potential.

In the above-described embodiment, the semiconductor module may further comprise a protective layer, provided on the substrate, having an opening in which a bump forming region is exposed, and the bump may have an embedded portion embedded into the opening of the protective layer and a bump protruding above an upper face of a periphery of the opening of the protective layer.

Still another embodiment of the present invention relates to a portable device. The portable device includes a semiconductor module according to any of the above-described semiconductor module.

By employing this embodiment, the portable device is equipped with the semiconductor module where the infiltration of water is suppressed. Thus, the operation reliability of the semiconductor module is improved, so that the operation reliability of the portable device is improved.

Effect of the Invention

The present invention suppresses the infiltration of water through a space between a sealing resin and a substrate in a structure where a semiconductor device mounted on the substrate is sealed by the sealing resin.

BRIEF DESCRIPTION OF THE DRAWINGS

FIGS. 4A to 4D are cross-sectional views showing a process in a method for forming a semiconductor module according to a first embodiment.

FIGS. 5A to 5C are cross-sectional views showing a process in a method for forming a semiconductor module according to a first embodiment.

FIGS. 14A to 14C are cross-sectional views showing a process in a method for fabricating a semiconductor module according to a fourth embodiment.

FIGS. 15A to 15C are cross-sectional views showing a process in a method for fabricating a semiconductor module according to a fourth embodiment.

FIGS. 16A and 16B are cross-sectional views showing a process in a method for fabricating a semiconductor module according to a fourth embodiment.

FIGS. 17A and 17B are cross-sectional views showing a process in a method for fabricating a semiconductor module according to a fourth embodiment.

FIGS. 25A to 25C are cross-sectional views showing a process in a method for fabricating a semiconductor module according to a fifth embodiment.

FIGS. 26A to 26C are cross-sectional views showing a process in a method for fabricating a semiconductor module according to a fifth embodiment.

BEST MODE FOR CARRYING OUT THE INVENTION

Figure 1:
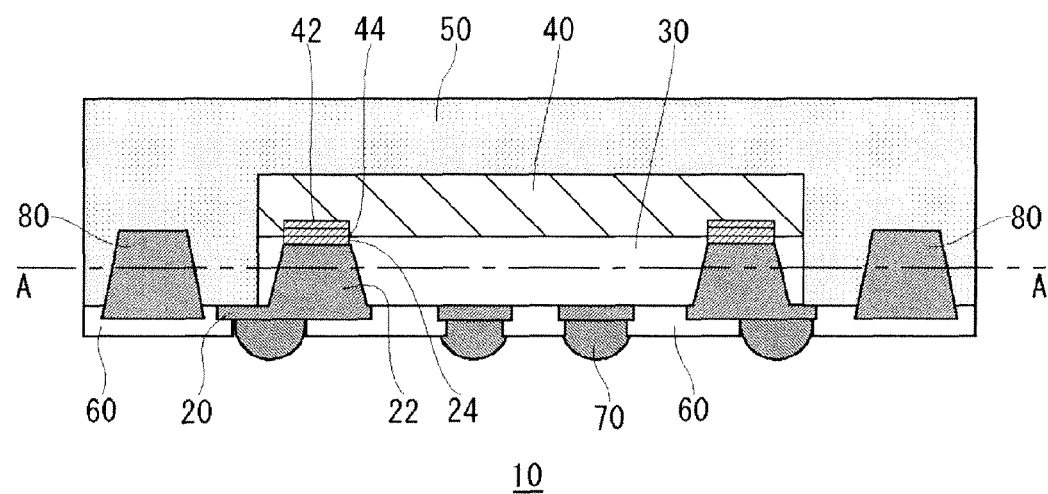
FIG. 1 is a schematic cross-sectional view showing a structure of a semiconductor module according to a first embodiment.

Hereinafter, the present invention will be described based on preferred embodiments with reference to the drawings. The same or equivalent components illustrated in each drawing will be denoted with the same reference numerals, and the repeated description thereof will be omitted as appropriate.

First Embodiment

Figure 2:
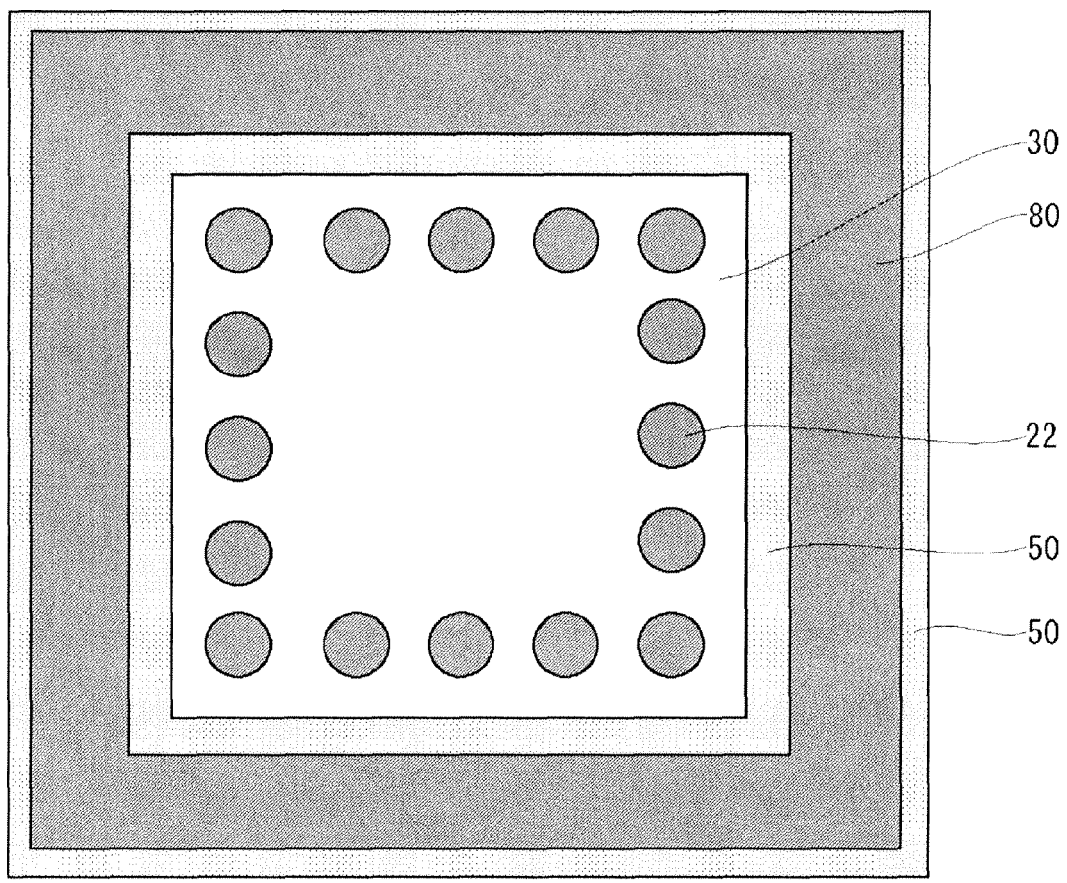
FIG. 2 shows a planar arrangement of bumps that constitute a semiconductor module according to a first embodiment and FIG. 2 is a plain view showing a cross section taken along the line A-A of FIG. 1.

FIG. 1 is a schematic cross-sectional view showing a structure of a semiconductor module 10 according to a first embodiment. FIG. 2 is a plain view showing a cross section taken along the line A-A of FIG. 1.

The semiconductor module 10 is of a structure such that no core substrate is provided therein. More specifically, a semiconductor device 40 mounted on an insulating resin layer 30 formed on a wiring layer 20 is sealed by a sealing resin 50.

A bump electrode 22 protruding on a semiconductor device 40 side is integrally formed with the wiring layer 20. Forming the wiring layer 20 integrally with the bump electrode 22 allows the connection reliability between the wiring layer 20 and the bump electrode 22 to enhance. The wiring layer 20 and the bump electrode 22 are formed of a conducive material, preferably a rolled metal or more preferably a rolled copper. Or the wiring layer 20 and the bump electrode 22 may be formed of electrolyte copper or the like.

A protective layer 60 is provided on a main surface of the wiring layer 20 opposite to the insulating resin layer 30. This protective layer 60 protects the wiring layer 20 against oxidation or the like. The protective layer 60 may be a solder resist layer, for instance. Openings are formed in predetermined positions of the protective layer 60, and the wiring layer 20 is partially exposed there. Also, the protective layer 60 covers not only a lower surface of the wiring layer 20 but also lower surfaces of the insulating resin layer 30, the sealing resin 50 and bumps 80 (described later). Note here that the wiring layer 20 and the protective layer 60 according to the present embodiment are examples of "substrate" having an interface (surface boundary) between them (the wiring layer 20 and the protective layer 60) and the sealing resin 50.

A solder ball 70, which functions as an external connection electrode, is formed within the opening provided in the protective layer 60. And the solder ball 70 and the wiring layer 20 are electrically connected to each other. The positions in which the solder balls 70 are formed, namely, regions in which the openings are formed are, for instance, targeted positions where circuit wiring is extended through the wiring layer 20 (rewiring). The diameter of the solder ball 70 may be 100 to 300 μm, for instance.

The overall shape of the bump electrode 22 is narrower toward the tip portion thereof. A Ni/Au layer 24 is provided on the tip portion of the bump electrode 22. The diameters of the bottom and tip portions of each bump electrode 22 is 30 to 50 μm and 20 to 30 μm, respectively.

Though the insulating resin layer 30 preferably has the adhesion properties, the material used for the insulating resin layer 30 is not limited to any particular one as long as it is a resin having electrical insulation properties. The insulating resin layer 30 is formed of, for example, a material that develops plastic flow when pressurized. An example of the material that develops plastic flow when pressurized is epoxy-based thermosetting resin. The epoxy-based thermosetting resin to be used for the insulating resin layer 30 may be, for example, one having viscosity of 1 kPa·s under the conditions of a temperature of 160° C. and a pressure of 8 MPa. If a pressure of 5 to 15 MPa is applied to this epoxy-based thermosetting resin at a temperature of 160° C., then the viscosity of the resin will drop to about ⅛ of the viscosity thereof with no pressurization. In contrast to this, an epoxy resin in B stage before thermosetting has no viscosity, similarly to a case when the resin is not pressurized, under a condition that the temperature is less than or equal to a glass transition temperature Tg. And the epoxy resin develops no viscosity even when pressurized under a condition that the temperature is less than or equal to the glass transition temperature Tg. Also, this epoxy-based thermosetting resin is a dielectric substance having a permittivity of about 3 to 4.

Besides, the insulating resin layer 30 may be formed of a thermosetting resin such as a melamine derivative (e.g., BT resin), liquid-crystal polymer, epoxy resin, PPE resin, polyimide resin, fluorine resin, phenol resin or polyamide bismaleimide, or the like.

The semiconductor device 40 has device electrodes 42 disposed counter to the bump electrodes 22, respectively. A device protective layer, made of polyimide or the like, in which openings are so provided that the device electrodes 42 are exposed, may be laminated on one main surface of the semiconductor device 40 on a side thereof in contact with the insulating resin layer 30. A Ni/Au layer 44 covers the surface of the device electrode 42. A specific example of the semiconductor device 40 is a semiconductor chip such as an integrated circuit (IC) or a large-scale integrated circuit (LSI). For example, aluminum (Al) is used as the device electrode 42.

The insulating resin layer 30 is provided between the wiring layer 20 and the semiconductor device 40. The wiring layer 20 is press-bonded to one main surface of the insulating resin layer 30, whereas the semiconductor device 40 is press-bonded to the other main surface thereof. The bump electrode 22, which penetrates the insulating resin layer 30, is electrically connected to the device electrode 42 provided on the semiconductor device 40. More specifically, in the present embodiment, the surfaces of the bump electrode 22 and the device electrode 42 are covered with Ni/Au layers 22 and 44, respectively, and the bump electrode 22 and the device electrode 42 are connected by bonding the golds disposed on their respective outermost surfaces (Au—Au bonding). Hence, the connection reliability between the bump electrode 22 and the device electrode 42 is further improved.

In the semiconductor module 10 according to the first embodiment, the bump 80 is so formed as to surround the semiconductor device 40 along four sides of the semiconductor device 40 (See FIG. 2). The material used for the bump 80 is not subject to any particular limitation, but the bump 80 is preferably formed of the same material as that used for the wiring layer 20 and the bump electrode 22. Since the same material as the wiring layer 20 and the bump electrode 22 is used for the bump 80, the bump 80 can be fabricated simultaneously in a process of fabricating the wiring layer 20 and the bump electrodes 22 and therefore the fabrication process is simplified. More specifically, the bump 80 is formed integrally with the wiring layers 20 as shown in FIG. 1, and the bump 80 protrudes from the wiring layer 20 toward a semiconductor device 40 side, similarly to the bump electrodes 22. The cross section of the bump 80 is of a shape such that the width thereof is narrower toward the tip portion thereof, as shown in FIG. 1. The widths of the bottom and the tip portion of the bump 80 are 30 to 50 μm and 20 to 30 μm, respectively, and are more preferably 50 μm and 30 μm, respectively. The height of the bump 80 is preferably higher than the height of the bump electrode 22 itself added with the thickness of the Ni/Au layer 24. In other words, the head portion of the bump 80 is located above a joint (connection part), which is an Au—Au bonding interface, between the bump electrode 22 and the device electrode 42.

The bump 80, which is arranged accordingly and has such a shape as described above, is interposed between the protective layer 60 and the sealing resin 50 and is also embedded in the sealing resin 50 with the head portion of the bump 80 disposed toward the sealing resin 50 from a protective film 60 side.

By employing the semiconductor module 10 as described above, the bump 80, which is embedded in the sealing resin 50, around the semiconductor device 40, with the head portion thereof disposed toward the sealing resin 50 from a protective film 60 side, serves as a barrier. Thus, the infiltration of water from outside the semiconductor module 10 into a device mounting region is suppressed. In particular, by locating the head portion of the bump 80 above the connection part between the bump electrode 22 and the device electrode 42, the infiltration of water into the Au—Au bonding interface can be reliably suppressed. In other words, if no bump 80 is provided, water will reach the Au—Au bonding interface if it climbs up to the height of the Ni/Au layer 24. However, where the bump 80 is provided, water does not reach the Au—Au bonding interface even if it climbs up to the height of the bump 80.

Also, by employing the semiconductor module 10 as described above, the bump 80 surrounds the semiconductor device 40 in its entirety. Thus the bump 80 plays a role of a reinforcing member and thereby makes the semiconductor module 10 less deformable or warpable after the formation of the sealing resin 50.

Since the bump 80 bites into the sealing resin 50, the bump 80 itself plays an anchor-like role between the sealing resin 50 and the protective layer 60. Thus, adhesion between the sealing resin 50 and the protective layer 60 can be improved.

Moreover, the surface of the bump 80 may be subjected a roughening treatment such as a CZ treatment (with the arithmetic mean roughness Ra being 1 µm to 2 µm, for instance). By employing this roughening treatment, the anchor effect resulting from fine unevenness (fine asperities) formed on the bump 80 improves adhesion between the bump 80 and the sealing resin 50. Also, by roughening the surface of the bump 80, the fine asperities formed on the bump 80 block the infiltration of water, thereby further suppressing the infiltration of water. The Ra of the surface of the bump 80 may be measured with a stylus type surface texture measuring instrument.

Also, since the bump 80 is formed of copper, the bump 80, which displays excellent thermal conductivity, is embedded into the sealing resin 50. Thus, the heat release performance of the semiconductor module 10 can be improved.

(Method for Fabricating Semiconductor Modules)

A method for manufacturing semiconductor modules 10 according to the first embodiment is described with reference to FIG. 3A to FIG. 5C.

Figure 3A:
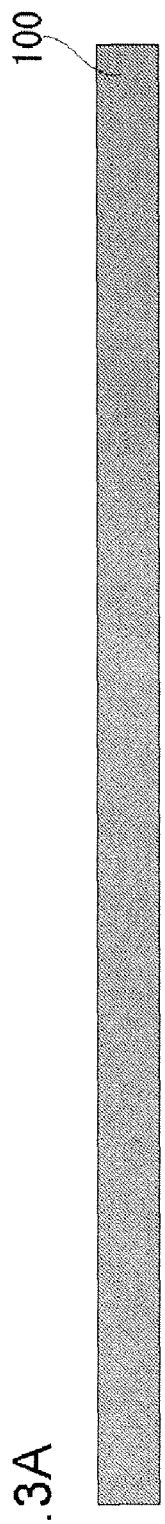
FIGS. 3A to 3D are cross-sectional views showing a process in a method for fabricating a semiconductor module according to a first embodiment.

As illustrated in FIG. 3A, a copper sheet 100 is first prepared as a metallic sheet having a thickness greater than the sum of the height of the bump electrode 22 and the thickness of the wiring layer 20 shown in FIG. 1.

Figure 3B:
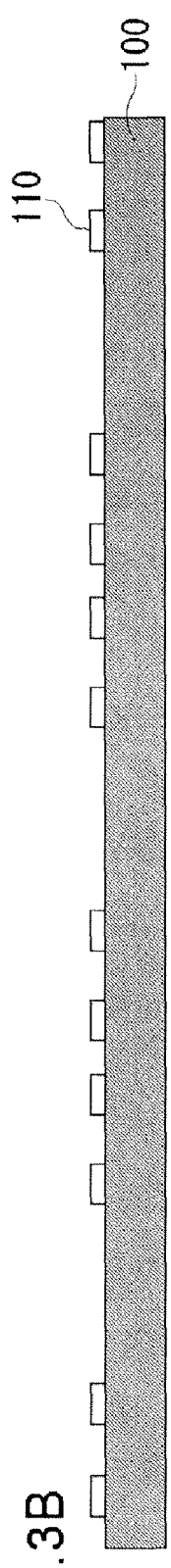
Figure 3C:
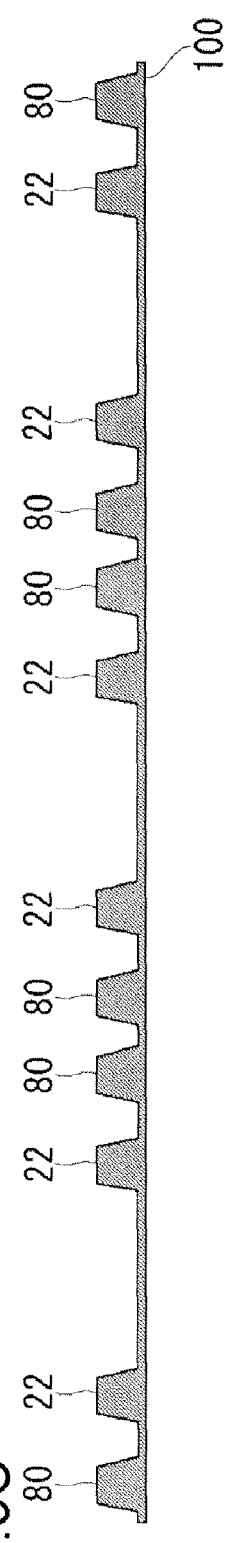

Then, as illustrated in FIG. 3B, resists 110 are formed selectively in alignment with a pattern of bump electrodes 22 and the bumps 80 using a photolithography method. More specifically, a resist film of predetermined film thickness is affixed to the copper sheet 100 by a laminating apparatus, and it is then subjected to exposure by the use of a photo mask having the pattern of the bump electrodes 22 and the bumps 80 as shown in FIG. 3C (described later). After this, the resists 110 are selectively formed on the copper sheet 100 by a development. To improve the adhesion of the resists 110 to the copper sheet 100, it is desirable that a pretreatment, such as grinding, cleaning and the like, be performed as necessary on the surface of the copper sheet 100 before the lamination of the resist film thereon.

Then, as illustrated in FIG. 3C, wet etching is done using the resists 110 as a mask and thereby the electrodes 22 and the bumps 80 having a predetermined pattern are formed on the copper sheet 100. At this stage, the height of the bump electrode 22 is equal to that of the bump 80. A plurality of bump electrodes 22 and a plurality of bumps 80 are formed in a matrix shape on the copper sheet 100.

Figure 3D:
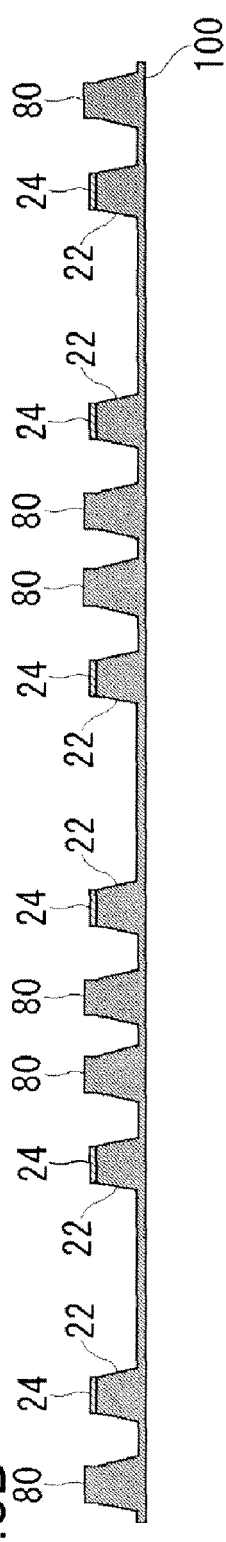

Then, as illustrated in FIG. 3D, Ni/Au layers 24 are formed on top surfaces of the bump electrodes 22 by using gold-resistant resists (not shown) having openings on the top surfaces of the bump electrodes 22, using an electrolytic plating. At the same time, top surfaces of the bumps 80 are plated with copper by using resists (not shown) having openings on the top surfaces of the bumps 80. At this time, the height of the bump 80 is such that the height thereof is greater than the height of the bump electrode 22 added with the height of the Ni/Au layer 24. Note here that the height of the bump 80 is a distance between a base of the bump 80 and a tip end thereof. Also, the height of the bump electrode 22 is a distance between the base of the bump electrodes 22 and the tip end thereof.

Then, as illustrated in FIG. 4A, an insulating resin layer 30 whose thickness is greater than the height of the bump electrode 22 is laminated on a device mounting region R that includes a region in which the bump electrodes 22 are formed. At this stage, a tip end (Ni/Au layer 24) of the bump electrode 22 is embedded in the insulating layer 30.

Then, as shown in FIG. 4B, the insulating resin layer 30 is turned into thin film by a plasma etching process, and thereby the tip end (Ni/Au layer 24) of the bump electrode 22 is exposed.

Then, as illustrated in FIG. 4C, a semiconductor device 40 is mounted on top of the insulating resin layer 30. The semiconductor device 40 prepared here has device electrodes 42, and the Ni/Au layers 44 have been formed on the surface layers of the device electrodes 44. The semiconductor device 40 and the bump electrodes 22 are press-bonded so as to form the Au—Au bonding, and thereby device electrodes 42 of the semiconductor device 40 are electrically connected to the bump electrodes 22. The device electrodes 42 of the semiconductor device 40 and the bump electrodes 22 may be bonded together by solder members instead of Au—Au bonding.

Then, as illustrated in FIG. 4D, a sealing resin 50 is applied using a potting method, a printing process or the like, so as to seal the semiconductor device 40. If there are any unwanted portions in the applied sealing resin 50, such unwanted portions will be removed with a squeegee or like means. The sealing resin 50 is thermally cured as necessary. In this process, the bumps 80 are covered with the sealing resin 50. In other words, a structure is realized where the bumps 80 are embedded in the sealing resin 50.

Then, as illustrated in FIG. 5A, the copper sheet 100 is selectively removed, using known photolithography method and etching method, so as to form wiring layers (rewiring) 20 of a predetermined pattern. In this process, the bumps 80 are separated from the wiring layers 20.

Then, as illustrated in FIG. 5B, a protective layer 60 comprised of a photo solder resist is formed on the whole of surfaces where the wiring layers 20 are formed, and then the protective layer 60 is selectively removed using known photolithography method and etching method in such a manner that predetermined portions (solder mounting portions) of the wiring layers 20 are opened. Subsequently, solder balls 70 are mounted on the predetermined portions (solder mounting portions) of the wiring layer 20, using a solder printing method. Through the processes performed so far, a module assembly 400 in which semiconductor modules are integrally formed in a matrix shape is formed.

Then, as illustrated in FIG. 5C, the module assembly 400 is diced into a plurality of individual modules 10 by performing a dicing process.

Through the processes as described above, the semiconductor modules 10 according to the first embodiment are manufactured. By employing this fabrication method, the process of forming the bump electrodes 22 and the process of forming the bumps 80 can be performed simultaneously. Thus, the number of the steps required for the formation of the bumps 80 is minimized and therefore the process of manufacturing the semiconductor modules 10 can be simplified.

(Examples of Installation for Bumps)

In the above-described first embodiment, the bump 80 surrounds the entire semiconductor device 40 but it is not indispensable that the bump 80 surrounds the entire semiconductor device 40.

Figure 6:
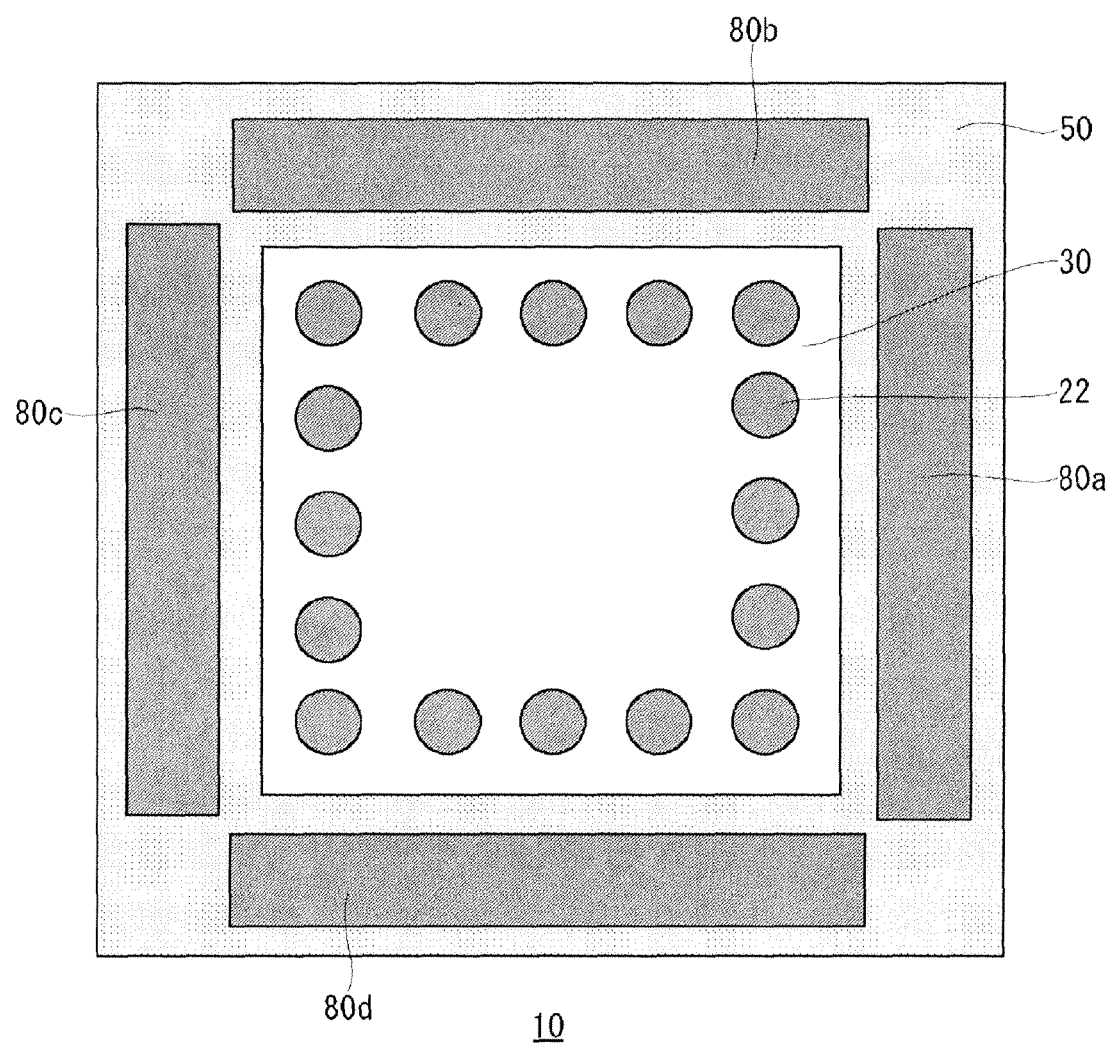
FIG. 6 is a plain view showing an example of installation of bumps that constitute a semiconductor module.

For example, as shown in FIG. 6, bumps 80a to 80d may be so formed as to surround the semiconductor device 40 along four sides of the semiconductor device 40, respectively, and a space may be provided between adjacent bumps 80, which are at right angles to each other, around each corner of the semiconductor device 40.

The arrangement where the spaces are provided around the corners of the semiconductor device 40 suppresses the concentration of stress exerting on the corners of the semiconductor module 10 due to the difference in thermal expansion coefficients between the bump 80 and the sealing resin 50 under a heat cycle. As a result, it is possible to suppress the solder balls 70 provided in the neighborhood of the corners of the semiconductor module 10 from breaking or falling away, and eventually the connection reliability of the semiconductor module 10 can be improved.

If the bump 80 is provided along at least one side of the semiconductor device 40, the infiltration of water can be suppressed in said at least one side of the semiconductor device 40. For example, if the infiltration of water from one direction is to be suppressed because of a condition of the installation position of the semiconductor module 10, it will be desirable that the bump 80 is installed in a direction orthogonal to said one direction.

Second Embodiment

Figure 7:
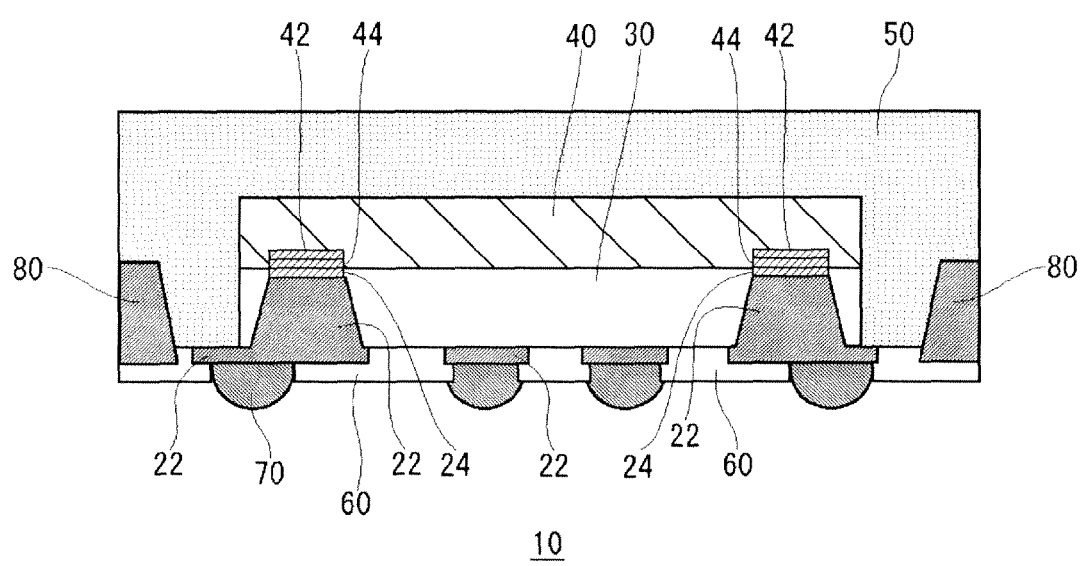
FIG. 7 is a schematic cross-sectional view showing a structure of a semiconductor module according to a second embodiment.

FIG. 7 is a schematic cross-sectional view showing a structure of a semiconductor module 10 according to a second embodiment. The semiconductor module 10 according to the second embodiment differs from that according to the first embodiment in the feature that the bump 80 is exposed on a lateral side of the sealing resin 50. The other structural components in the second embodiment are similar to those in the first embodiment, and the repeated description of the same structural components as those in the first embodiment is omitted as appropriate.

Similar to the first embodiment, the infiltration of water from the outside is suppressed by the bump 80, in the semiconductor module according to the second embodiment. In addition to this feature, the bump 80 is exposed on the lateral side of the package and therefore an outer part of the sealing resin 50 is omitted. As a result, the total area occupied by the semiconductor module 10 according to the second embodiment is smaller than that according the first embodiment.

(Fabrication Method)

Figure 8:
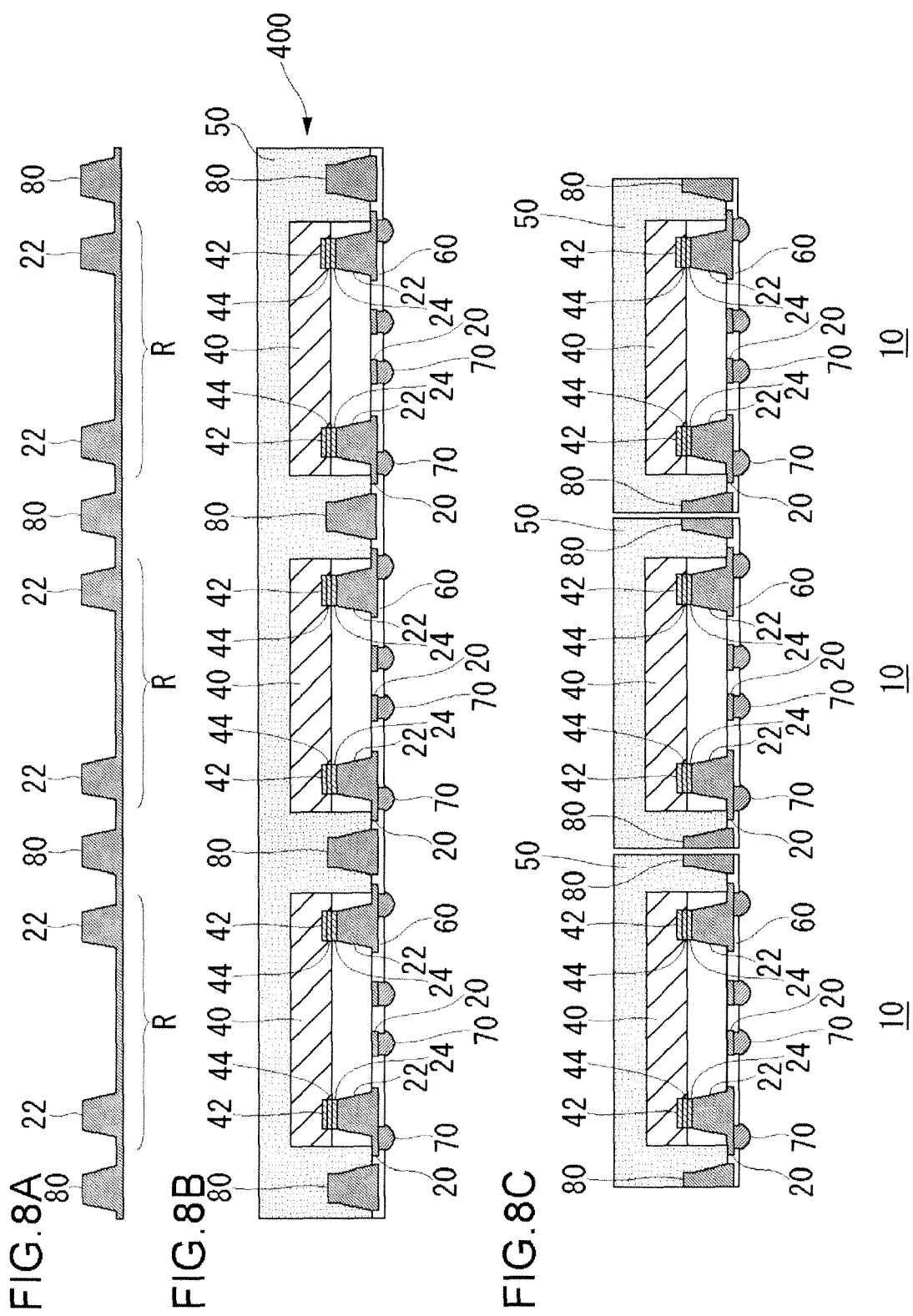
FIGS. 8A to 8C are cross-sectional views showing a process in a method for forming a semiconductor module according to a second embodiment.

Referring to FIG. 8, a description is given of a method for fabricating semiconductor modules 10 according to the second embodiment centering around differences from the method according to the first embodiment.

As illustrated in FIG. 8A, according to the second embodiment, a common bump 80 is formed in between the adjacent device mounting regions R by the use of a copper sheet 100.

Then, through the similar processes to those in the first embodiment, a module assembly 400 as shown in FIG. 8B is formed.

Then, as illustrated in FIG. 8C, the module assembly 400 is diced into a plurality of individual modules 10 by dicing each bump 80 at the center thereof.

Through the processes as described above, the semiconductor modules 10 according to the second embodiment are manufactured.

Third Embodiment

Figure 9:
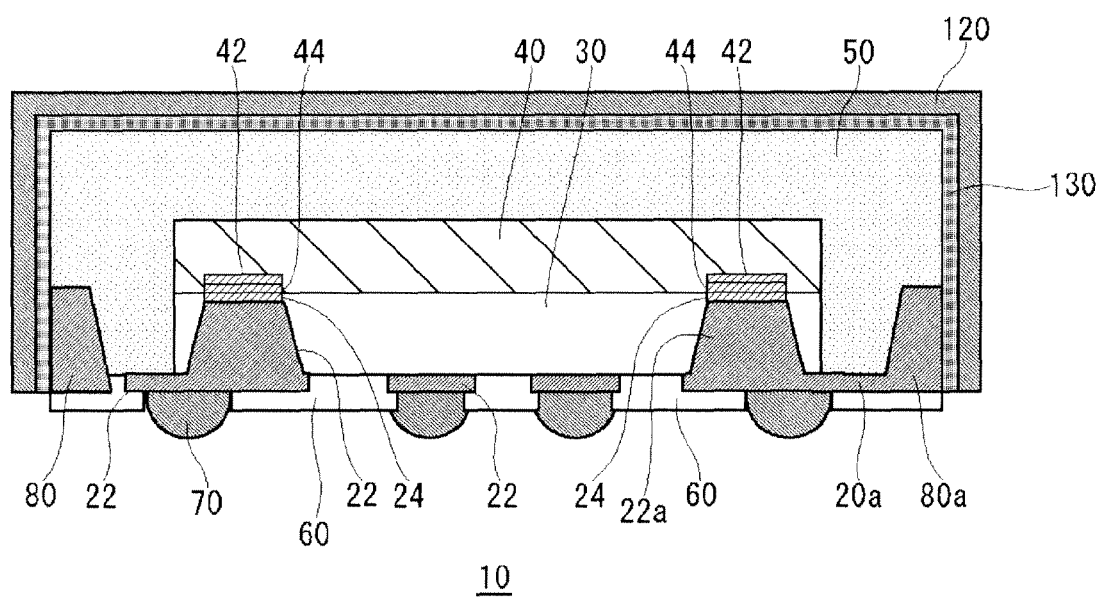
FIG. 9 is a schematic cross-sectional view showing a structure of a semiconductor module according to a third embodiment.

FIG. 9 is a schematic cross-sectional view showing a structure of a semiconductor module 10 according to a third embodiment. The semiconductor module 10 according to the third embodiment differs mainly from that according to the second embodiment in the feature that the sealing resin 50 is covered with a metallic foil 120.

More specifically, a metallic foil 120 is fixed above and on lateral sides of the sealing resin 50 through the medium of an electrically conductive adhesive 130. The metallic foil 120 is preferably aluminum foil of 15 to 50 μm in thickness. The metallic foil 120 is electrically connected to a bump 80a on a lateral side of the sealing resin 50. This bump 80a is electrically connected to a bump electrode 22a through the medium of a wiring layer 20a. As a result, the potential of the metallic foil 120 is the ground potential. Here, of the bump electrodes 22 connected to the semiconductor device 40, the bump electrode 22a is a bump electrode connected to a device electrode 42a that is a ground terminal.

In this manner, the semiconductor device 40 is covered with the metallic foil 120 fixed to the ground potential, so that the radio interference the semiconductor device 40 receives is suppressed. Also, as compared with the conventional can encapsulation, a space (distance) between the metallic foil 120 and the sealing resin (package) 50 can be made smaller. Thus, the size of the semiconductor module 10 can be made smaller.

Also, covering the sealing resin (package) 50 with the metallic foil 120 ensures suppressing the infiltration of water from outside.

(Fabrication Method)

Figure 10:
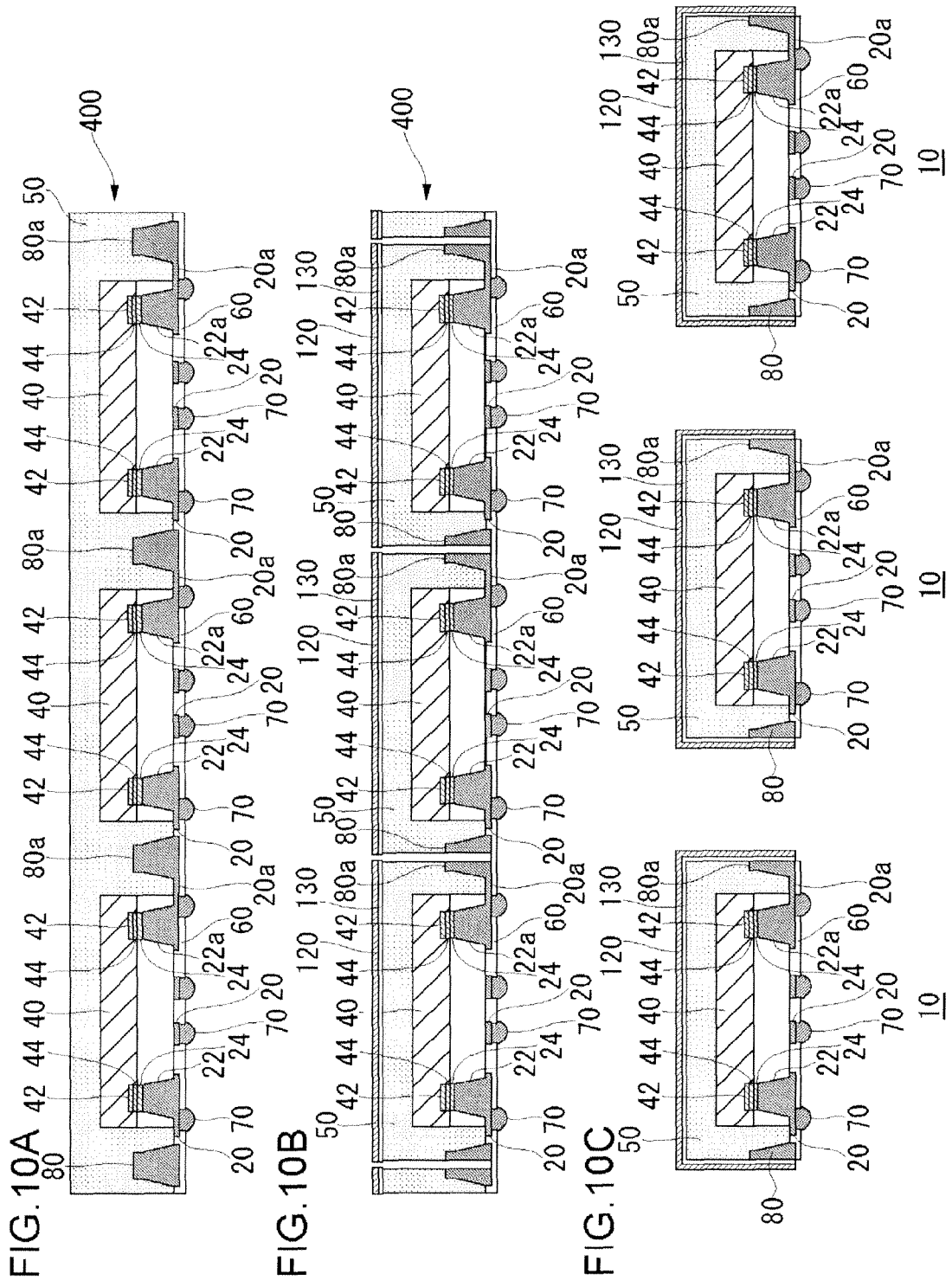
FIGS. 10A to 10C are cross-sectional views showing a process in a method for forming a semiconductor module according to a third embodiment.

Referring to FIG. 10 and the fabrication method implemented in the second embodiment, a description is given of a method for fabricating semiconductor modules 10 according to the third embodiment.

Through the similar processes to those in the second embodiment, a module assembly 400 as shown in FIG. 10A is first formed. Different from the second embodiment, when the wiring layer 20 is patterned, a wiring layer 20a is formed. Here, the wiring layer 20a electrically connects the bump 80a to the bump electrode 22a connected to the device electrode which is the ground terminal. Such a connection pair between the bump electrode 22a and the bump 80a is provided per the device mounting region.

Then, as illustrated in FIG. 10B, the bump 80 and the bump 80a are half diced at their centers. Then, the metallic foil 120 where the electrically conductive adhesive 130 is applied to one surface thereof is placed on top of a package including a plurality of semiconductor devices 40, and a part of the metallic foil 120 is fixed with the electrically conductive adhesive. In this state, a part of the metallic foil 120 positioned in the half-diced area is cut off.

Then, as illustrated in FIG. 10C, the remaining part of the metallic foil 120 is fixed to the cut surfaces of the sealing resin 50 and the bump 80 (the bump 80a) with the electrically conductive adhesive 130. Thereby, the metallic foil 120 and the bump 80a are electrically connected to each other, so that the potential of the metallic foil 120 can be fixed to the ground potential. Further, the module assembly 400 is diced into a plurality of individual modules 10. The dicing width is about 150 μm, which is a sufficient length relative to the thickness of the semiconductor module 10. As illustrated in FIG. 10C, the remaining part of the metallic foil 120 can be fixed to the cut surfaces of the sealing resin 50 and the bump 80 (bump 80a).

Through the processes as described above, the semiconductor modules 10 according to the third embodiment are manufactured.

Fourth Embodiment

Figure 11:
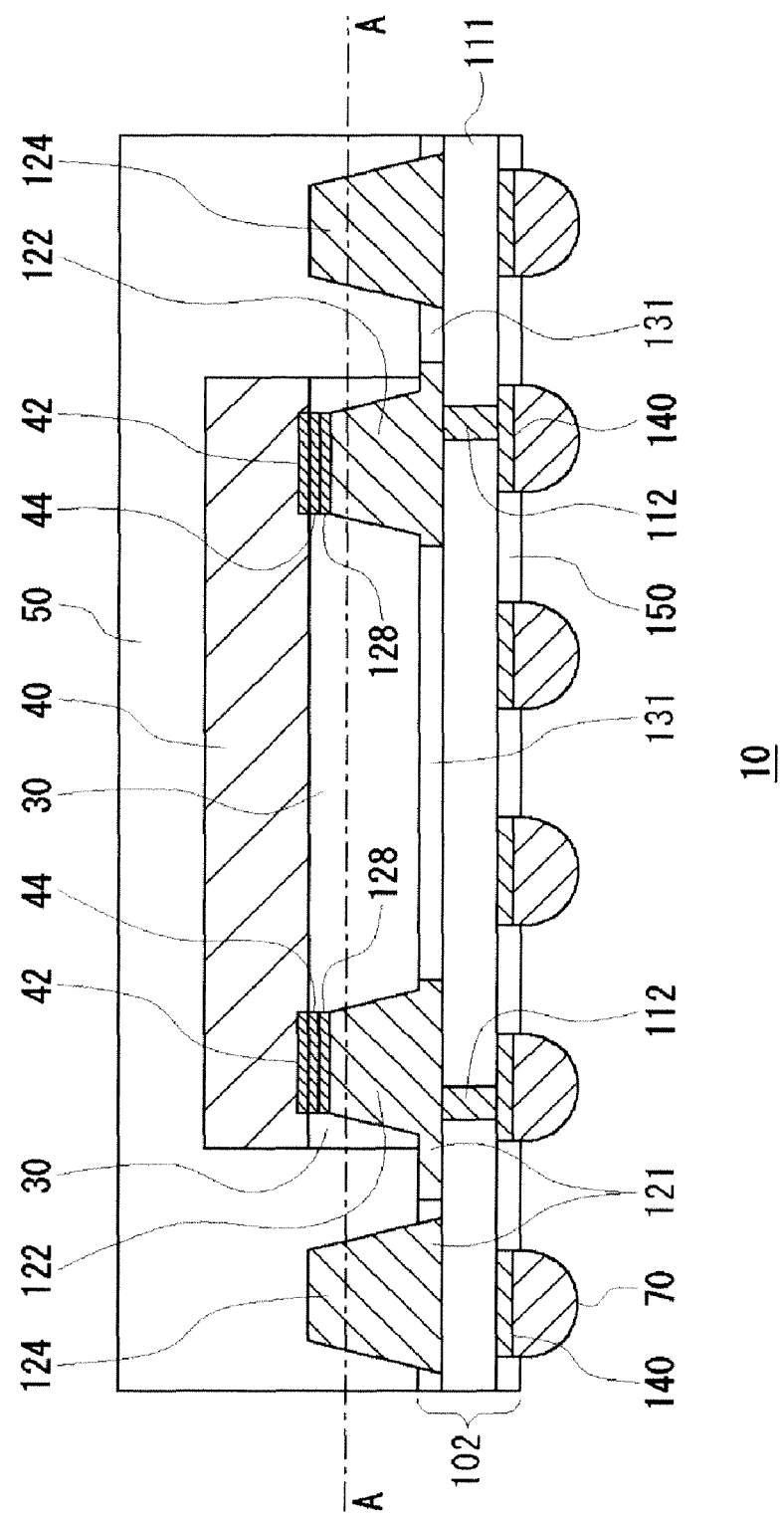
FIG. 11 is a schematic cross-sectional view showing a structure of a semiconductor module according to a fourth embodiment.
Figure 12:
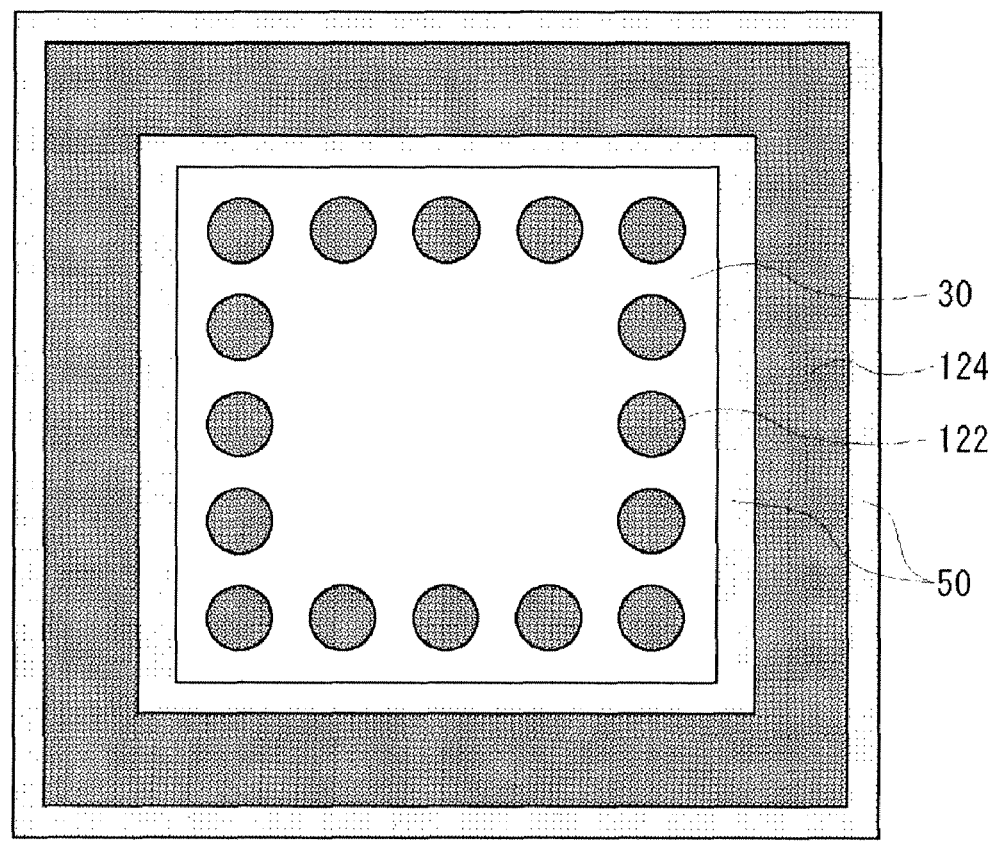
FIG. 12 shows a planar arrangement of bumps that constitute a semiconductor module according to a fourth embodiment and FIG. 12 is a plain view showing a cross section taken along the line A-A of FIG. 11.

FIG. 11 is a cross-sectional view showing a structure of a semiconductor module 10 according to a fourth embodiment. FIG. 12 is a plain view showing a cross section taken along the line A-A of FIG. 11.

The semiconductor module 10 includes a device mounting board 102 and a semiconductor device 40 which is mounted on the device mounting board 102 and which is sealed by a sealing resin 50.

The device mounting board 102 includes a substrate 111, wiring layers 121 and protective layers 131, which are provided on one main surface of the substrate 111, wirings layers 140 and protective layers 150, which are provided on the other main surface of the substrate 111.

The material used for the substrate 111 may be, for instance, a thermosetting resin such as a melamine derivative (e.g., BT resin), liquid-crystal polymer, epoxy resin, PPE resin, polyimide resin, fluorine resin, phenol resin or polyamide bismaleimide, or the like. From the viewpoint of improving the heat radiation of the semiconductor module 10, it is preferable that the substrate 111 has a high thermal conductivity. In this respect, it is desirable that the substrate 111 contains, as a high thermal conductive filler, silver, bismuth, copper, aluminum, magnesium, tin, zinc, or an alloy thereof or that the substrate 111 contains glass cloth.

The wiring layer 121 has a predetermined pattern and is provided on one main surface of the substrate 111 (on a mounting surface of the semiconductor device 40 in the present embodiment). The wiring layer 121 is formed of a conductive material such as copper. A bump 124 and a bump electrode 122, electrically connected to a device electrode 42 provided in the semiconductor device 40, are provided in predetermined positions of the wiring layer 121.

The wiring layer 121 and the bump electrode 122 may be formed of electrolyte copper or the like. A gold plating layer 128 such as a Ni/Au layer, is provided on a top surface of the bump electrode 122. The gold plating layer 128 suppresses the oxidation of the bump electrode 122. If the Ni/Au layer is to be formed as the gold plating layer 128, the thickness of Ni layer will be 1 μm to 15 μm, for instance, and the thickness of Au layer will be 0.03 μm to 1 μm, for instance.

A protective layer 60 is provided around the wiring layer 121. In the present embodiment, the protective layer 131 is so formed as to cover the wiring layers 121. This protective layer 131 protects the wiring layers 121 against oxidation. Openings in which bump electrode forming regions are exposed are formed in the protective layer 131. The bump electrodes 122 are provided on the wiring layers 121 in these openings. The protective layer 131 is formed of a photo solder resist, for instance, and the thickness of the protective layer 131 is 40 μm, for instance.

The wiring layer 140 has a predetermined pattern and is provided on the other main surface of the substrate 111. The wiring layer 140 is formed of a conductive material such as copper. The thickness of wiring layer 121 and the thickness of the wiring layer 140 are each 20 μm, for instance.

Via conductors 112 that penetrate the substrate 111 are provided at predetermined positions. The via conductor 112 is formed by a plating method using copper, for instance. The wiring layer 121 and the wiring layer 140 are electrically connected to each other by the via conductor 121.

The protective layer 150 is provided on the other surface of the substrate 111 in such a manner as to cover the wiring layer 140. This protective layer 150 protects the wiring layers 140 against oxidation or the like. The protective layer 150 has openings in which the solder balls 70 functioning as external connection electrodes are mounted on a land area of the wiring layer 140. The solder ball 70 is connected to the wiring layer 140 in an opening provided in protective layer 150, and the semiconductor module 10 is connected to a not-shown printed wiring substrate by the solder balls 70. The positions in which the solder balls 70 are formed, namely, regions in which the openings are formed are, for instance, the targeted positions where circuit wiring is extended through the wiring layer 140. The diameter of the solder ball 70 may be 100 to 300 μm, for instance. The protective layer 150 is formed by a photo solder resist, for instance. The thickness of the protective layer 150 may be 40 μm, for instance.

The insulating resin layer 30 is provided between the device mounting board 102 and the semiconductor device 40, and the semiconductor device 40 is bonded to the device mounting board 102 by the insulating resin layer 30.

Though the insulating resin layer 30 preferably has the adhesion properties, the material used for the insulating resin layer 30 is not limited to any particular one as long as it is a resin having electrical insulation properties. The material used for the insulating resin layer 30 may be, for instance, a thermosetting resin such as a melamine derivative (e.g., BT resin), liquid-crystal polymer, epoxy resin, PPE resin, polyimide resin, fluorine resin, phenol resin or polyamide bismaleimide, or the like.

The semiconductor device 40 has device electrodes 42 disposed counter to the bump electrodes 122, respectively. A device protective layer, made of polyimide or the like, in which openings are so provided that the device electrodes 42 are exposed, may be laminated on one main surface of the semiconductor device 40 on a side thereof in contact with the insulating resin layer 30. A gold plating such as a Ni/Au layer covers the surface of the device electrode 42. A specific example of the semiconductor device 40 is a semiconductor chip such as an integrated circuit (IC) or a large-scale integrated circuit (LSI). For example, aluminum (Al) is used as the device electrode 42. The semiconductor device 40 is sealed by the sealing resin 50 formed of epoxy resin or the like.

The bump electrode 122, which penetrates the insulating resin layer 30, is electrically connected to the device electrode 42 provided on the semiconductor device 40. More specifically, in the present embodiment, the surfaces of the bump electrode 122 and the device electrode 42 are covered with the gold plating layers 128 and 44, respectively, and the bump electrode 122 and the device electrode 42 are connected by bonding the golds disposed on their respective outermost surfaces (Au—Au bonding). Hence, the connection reliability between the bump electrode 122 and the device electrode 42 is further improved. The height of the bump electrode 122 may be 20 μm, for instance.

In the semiconductor module 10 according to the fourth embodiment, the bump 124 is formed on the wiring layers 121 in such a manner as to surround the semiconductor device 40 along four sides of the semiconductor device 40 (See FIG. 2). The material used for the bump 124 is not subject to any particular limitation, but the bump 124 is preferably formed of the same material as that used for the wiring layer 121 and the bump electrode 122. Since the same material as the wiring layer 121 and the bump electrode 122 is used for the bump 124, the bump 124 can be fabricated simultaneously in a process of fabricating the wiring layer 121 and the bump electrodes 122 and therefore the fabrication process is simplified. More specifically, the bump 124 is formed integrally with the wiring layers 121 as shown in FIG. 11, and the bump 124 protrudes from the wiring layer 121 toward a semiconductor device 40 side, similarly to the bump electrodes 122. The widths of the bottom and the tip portion of the bump 124 are 30 to 50 μm and 20 to 30 μm, respectively, and are more preferably 50 μm and 30 μm, respectively. The height of the bump 124 is preferably higher than the height of the bump electrode 122 itself added with the thickness of the gold plating layer 128. In other words, the head portion of the bump 124 is located above a joint (connection part), which is an Au—Au bonding interface, between the bump electrode 122 and the device electrode 42. The height of the bump 124 may be 30 μm, for instance.

The bump 124, which is arranged accordingly and has such a shape, is embedded in the sealing resin 50 with the head portion of the bump 124 disposed toward the sealing resin 50 from a device mounting board 102 side By employing the semiconductor module 10 as described above, the bump 124, which is embedded in the sealing resin 50, around the semiconductor device 40, with the head portion thereof disposed toward the sealing resin 50 from a device mounting board 102 side, serves as a barrier. Thus, the infiltration of water from outside the semiconductor module 10 into a device mounting region is suppressed. In particular, by locating the head portion of the bump 124 above the connection part between the bump electrode 122 and the device electrode 42, the infiltration of water into the Au—Au bonding interface can be reliably suppressed. In other words, if no bump 124 is provided, water will reach the Au—Au bonding interface if it climbs up to the height of the gold plating layer 128. However, where the bump 124 is provided, water does not reach the Au—Au bonding interface even if it climbs up to the height of the bump 124.

Also, by employing the present embodiment, the bump 124 surrounds the semiconductor device 40 in its entirety. Thus the bump 124 plays a role of a reinforcing member and thereby makes the semiconductor module 10 less deformable or warpable after the formation of the sealing resin 50.

Since the bump 124 bites into the sealing resin 50, the bump 124 itself plays an anchor-like role between the sealing resin 50 and the device mounting substrate 102. Thus, adhesion between the sealing resin 50 and the device mounting board 102 can be improved.

Moreover, the surface of the bump 124 may be subjected a roughening treatment such as the CZ treatment (with the arithmetic mean roughness Ra being 1 μm to 2 μm, for instance). By employing this roughening treatment, the anchor effect resulting from fine unevenness (fine asperities) formed on the bump 124 improves adhesion between the bump 124 and the sealing resin 50. Also, by roughening the surface of the bump 124, the fine asperities formed on the bump 124 block the infiltration of water, thereby further suppressing the infiltration of water. The Ra of the surface of the bump 124 may be measured with the stylus type surface texture measuring instrument.

Also, since the bump 124 is formed of copper, the bump 124, which displays excellent thermal conductivity, is embedded into the sealing resin 50. Thus, the heat release performance of the semiconductor module 10 can be improved.

(A Method for Fabricating Semiconductor Modules)

A method for manufacturing semiconductor modules 10 according to the fourth embodiment is described with reference to FIG. 13A to FIG. 17B.

Figure 13A:
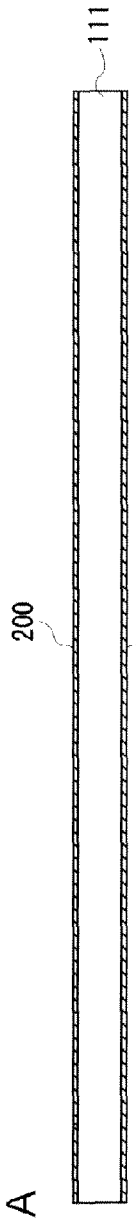
FIGS. 13A to 13D are cross-sectional views showing a process in a method for fabricating a semiconductor module according to a fourth embodiment.

As illustrated in FIG. 13A, a substrate 111 is prepared wherein a copper coil 200 is applied to one main surface of the substrate 111 and a copper coil 201 is applied to the other main surface thereof.

Figure 13B:
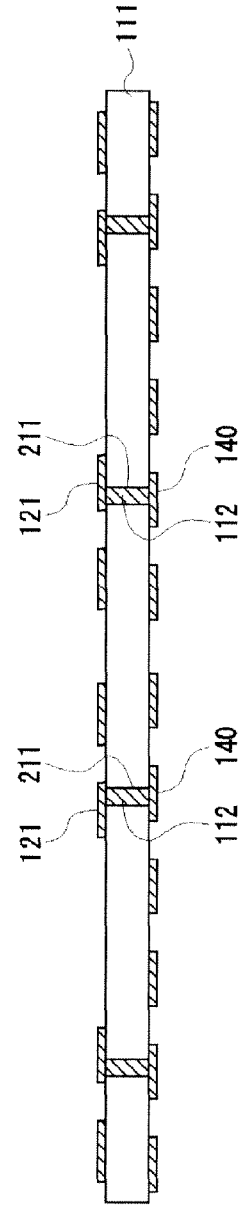

Then, as illustrated in FIG. 13B, via holes 211 are formed on predetermined regions of the substrate 111 and the copper coils 200 and 201 by a drill or laser process. Then, the via holes 211 are filled with copper by using an electroless plating method and an electrolytic plating method. At the same time, the copper foils 200 and 201 (see FIG. 13A) provided on the both main surfaces of the substrate 111 are thickened. Then, wiring layers 121 of predetermined patterns are formed on one main surface of the substrate 111, using known photolithography method and etching method. Also, wiring layers 140 are formed on the other main surface of the substrate 111, using known photolithography method and etching method.

Figure 13C:
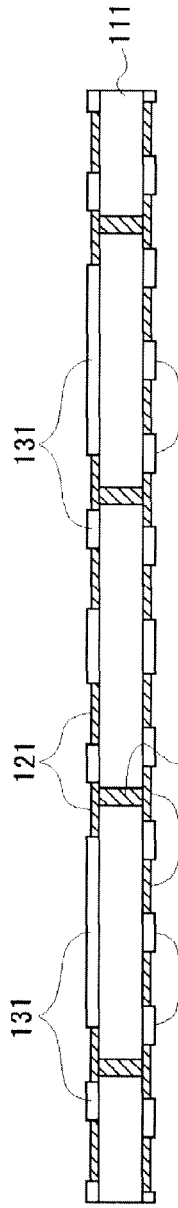

Then, as illustrated in FIG. 13C, formed using known photolithography method and etching method are protective layers 131 each having openings such that the bump electrode forming regions of the wiring layer 121 (e.g., the regions, as shown in FIG. 11, where the bump electrodes 122 are formed) and bump forming regions (the regions, as shown in FIG. 11, where the bumps 124 are formed) are exposed on one main surface of the substrate 111. Also formed are protective layers 150 each having openings such that the solder ball forming regions of the wiring layer 121 (e.g., the regions, as shown in FIG. 11, where the solder balls 70 are formed) are exposed on the other main surface of the substrate 111.

Figure 13D:
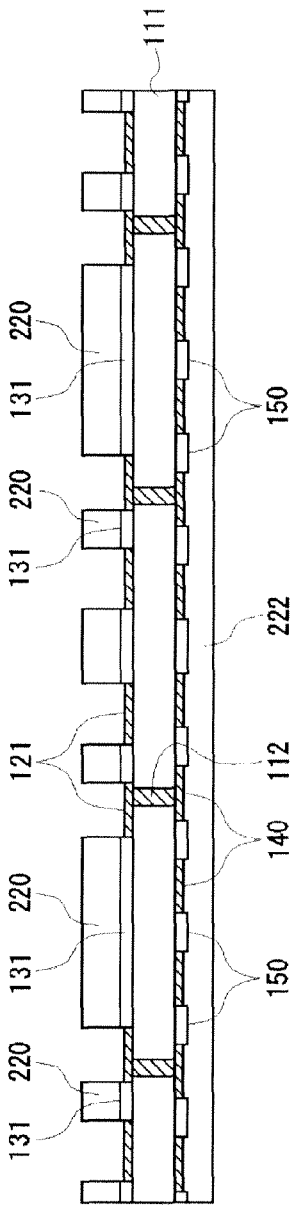

Then, as illustrated in FIG. 13D, masks 220 where each pattern thereof represents the bump electrode forming regions and the bump forming regions (as shown in FIG. 11) as the openings are formed on the wiring layers 121. Also, masks 222 are formed on the whole of surfaces of the wiring layers 140 to protect the wiring layers 140.

Then, as illustrated in FIG. 14A, the bump electrodes 124 are formed in such a manner that the bump electrode forming regions and the bump forming regions are selectively filled with copper by using a plating method. Thereby, a plurality of bump electrodes 122 and a plurality of bumps 124 are formed in a matrix shape on the wiring layer 140. It is to be noted here that at this stage the height of the bump 122 is equal to that of the bump electrode 122.

Then, as illustrated in FIG. 14B, masks 224, where each pattern thereof represents the bump forming regions as the openings, are stacked on the masks 220, using known photolithography method and etching method.

Then, as illustrated in FIG. 14C, the bump forming regions are further filled with copper by using the plating method and thereby the height of the bump 124 becomes greater than that of the bump electrode 122. At this time, it is desirable that the difference in height between the bump 124 and the bump electrode 122 be larger than the thickness of the gold plating layer 128 described later. Note here that the height of the bump 124 is a distance between a base of the bump 124 and a tip end thereof. Also, the height of the bump electrode 122 is a distance between a base of the bump electrode 122 and the tip end thereof.

Then, as illustrated in FIG. 15A, the masks 220, 222 and 224 are removed before gold-resistant resists 230 where each pattern thereof represents the bump electrode forming regions as the openings are formed on one side of the substrate 111, using known photolithography method and etching method. The bump electrode forming region is covered with the gold-resistant resist 230. After the formation of the gold-resistant resists 230, the gold plating layers 128 formed of Ni/Au layers are formed on the bump electrode forming regions, using the gold-resistant resists 230 as masks, by using the plating method. Thereby, the gold plating layer 128 is formed on the top surface of each bump electrode 122.

Then, as illustrated in FIG. 15B, after the gold-resistant resists 230 have been removed, the insulating resin layers 30 are stacked on the semiconductor device mounting regions, using a lamination apparatus.

Then, as illustrated in FIG. 15C, the insulating resin layers 30 are thinned by the use of $O_2$ plasma etching so that the gold plating layers 128 formed on the top faces of the bump electrodes 122 are exposed.

Then, as illustrated in FIG. 16A, the semiconductor devices 40 are mounted on top of the insulating resin layers 30. At the same time, the gold plating layers 128 and the gold plating layers 44 are pressurized and thereby joined together to realize "Au—Au bonding" and therefore the bump electrodes 122 and the device electrodes 42 are electrically connected to each other. The device electrodes 42 of the semiconductor device 40 and the bump electrodes 122 may be bonded together by solder members instead of Au—Au bonding.

Then, as illustrated in FIG. 16B, a sealing resin 50 is applied using the potting method, printing process, transfer model method or the like, so as to seal the semiconductor device 40. If there are any unwanted portions in the applied sealing resin 50, such unwanted portions will be removed with a squeegee or like means. The sealing resin 50 is thermally cured as necessary. In this process, the bumps 124 are covered with the sealing resin 50. In other words, a structure is realized where the bumps 124 are embedded in the sealing resin 50.

Then, as illustrated in FIG. 17A, the solder balls 70 are mounted in the openings of the protective layer 150, using a screen printing method. More specifically, the solder balls 70 are formed by printing a soldering paste, which is a pasty mixture of resin and solder material, in desired positions through a screen mask and then heating the printed paste to a solder melting point. Through the processes performed so far, a module assembly in which semiconductor modules are integrally formed in a matrix shape is formed.

Then, as illustrated in FIG. 17B, the module assembly is divided into individual semiconductor modules 10 by dicing the module assembly along scribe lines 250 demarcating a plurality of semiconductor module forming regions 240. After that, the residues or the like resulting from the dicing are removed by performing a cleaning processing on the individualized semiconductor modules 10 using a chemical.

Through the processes as described above, the semiconductor modules 10 according to the fourth embodiment are manufactured. By employing this fabrication method, the process of forming the bump electrodes 122 and the process of forming the bumps 124 can be performed simultaneously. Thus, the number of the steps required for the formation of the bumps 124 is minimized and therefore the process of manufacturing the semiconductor modules 10 can be simplified.

(Examples of Installation for Bumps)

In the above-described fourth embodiment, the bump 124 surrounds the entire semiconductor device 40 but it is not indispensable that the bump 124 surrounds the entire semiconductor device 40.

Figure 18:
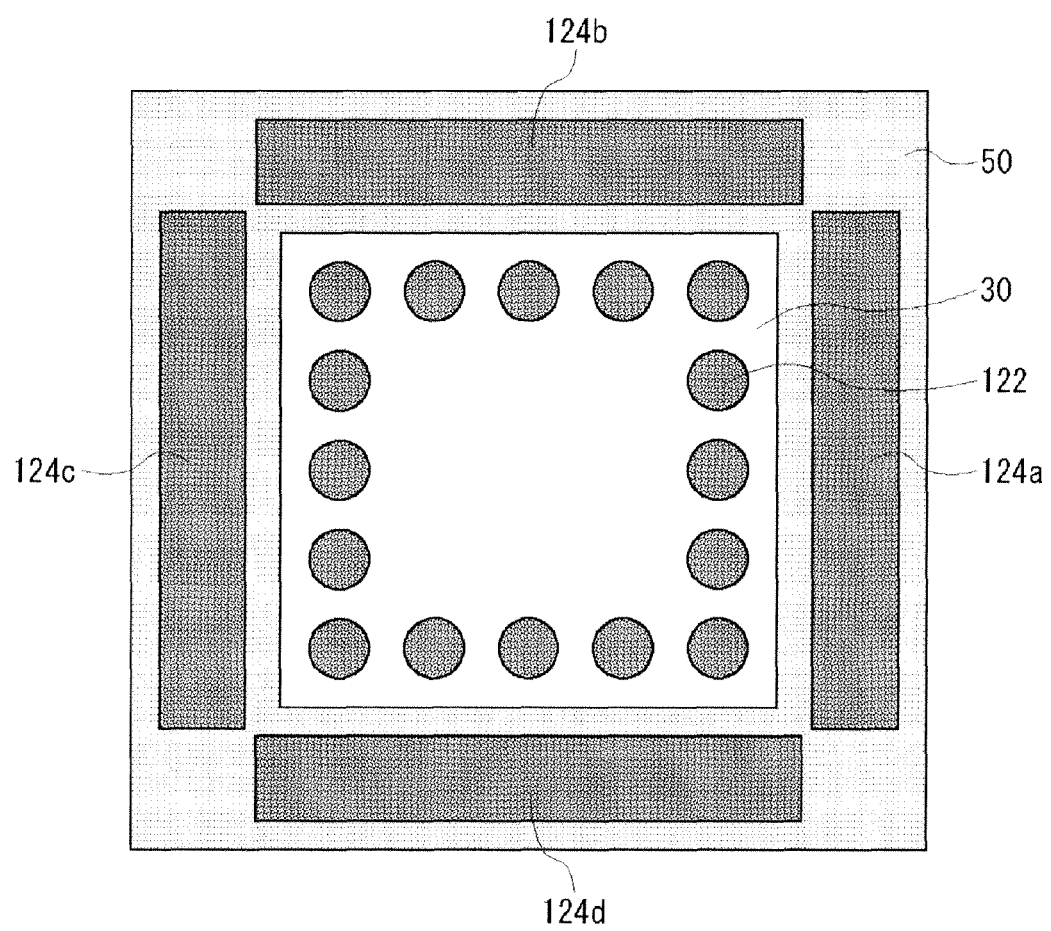
FIG. 18 is a plain view showing an example of installation of bumps that constitute a semiconductor module.

For example, as shown in FIG. 18, bumps 124a to 124d may be so formed as to surround the semiconductor device 40 along four sides of the semiconductor device 40, respectively, and a space may be provided between adjacent bumps 124, which are at right angles to each other, around each corner of the semiconductor device 40.

The arrangement where the spaces are provided around the corners of the semiconductor device 40 suppresses the concentration of stress exerting on the corners of the semiconductor module 10 due to the difference in thermal expansion coefficients between the bump 80 and the sealing resin 50 under a heat cycle. As a result, it is possible to suppress the solder balls 70 provided in the neighborhood of the corners of the semiconductor module 10 from breaking or falling away, and eventually the connection reliability of the semiconductor module 10 can be improved.

If the bump 124 is provided along at least one side of the semiconductor device 40, the infiltration of water can be suppressed in said at least one side of the semiconductor device 40. For example, if the infiltration of water from one direction is to be suppressed because of a condition of the installation position of the semiconductor module 10, it will be desirable that the bump 124 is installed in a direction orthogonal to said one direction.

Fifth Embodiment

Figure 19:
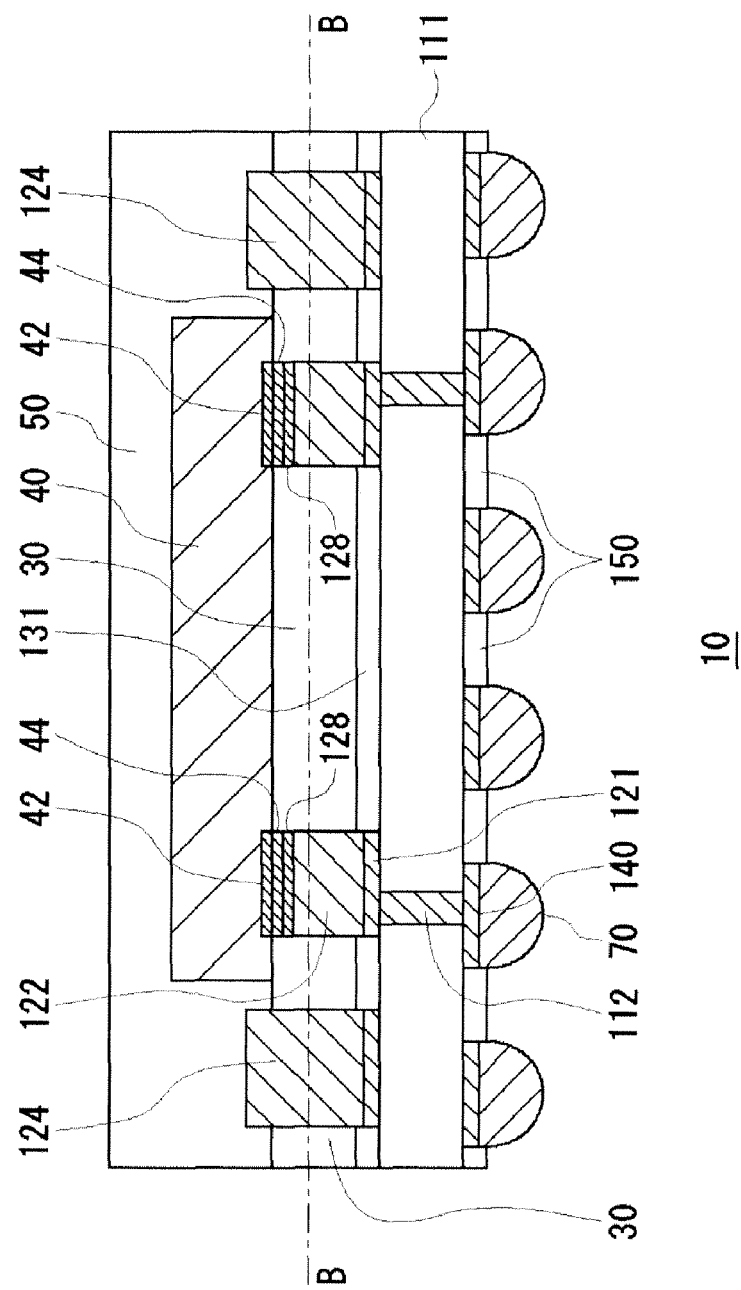
FIG. 19 is a schematic cross-sectional view showing a structure of a semiconductor module according to a fifth embodiment.
Figure 20:
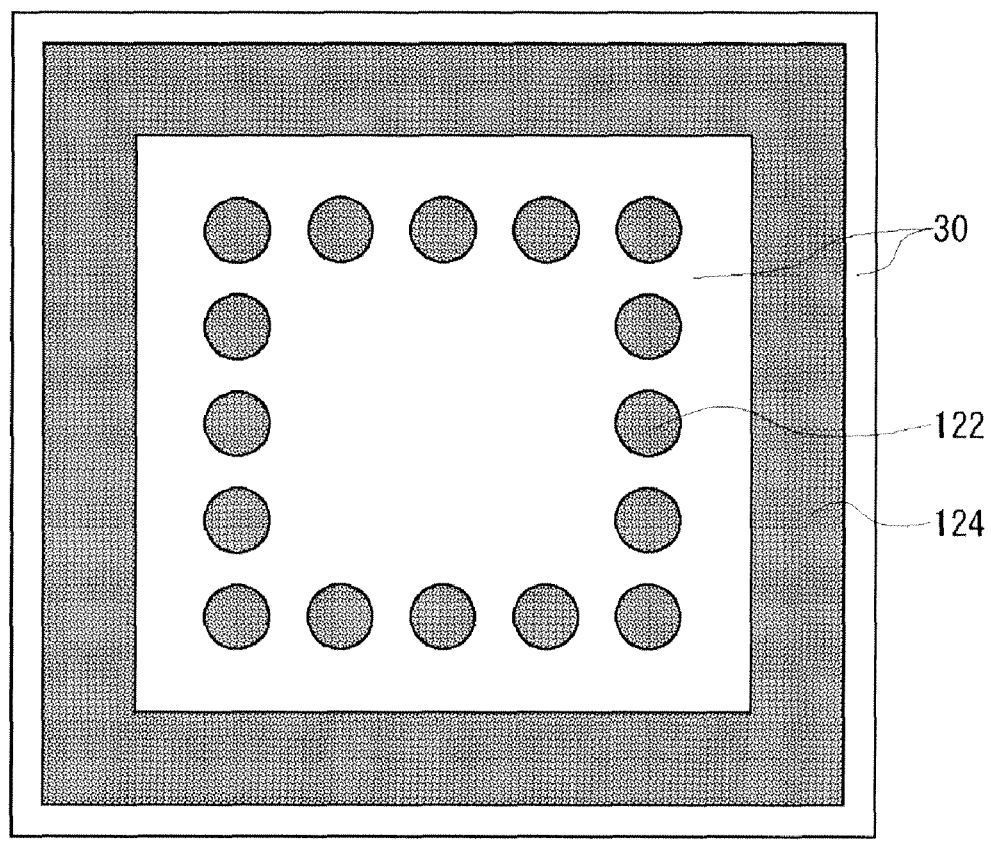
FIG. 20 shows a planar arrangement of bumps that constitute a semiconductor module according to a fifth embodiment and FIG. 20 is a plain view showing a cross section taken along the line B-B of FIG. 19.

FIG. 19 is a schematic cross-sectional view showing a structure of a semiconductor module 10 according to a fifth embodiment. FIG. 20 is a plain view showing a cross section taken along the line B-B of FIG. 19. The semiconductor module 10 according to the fifth embodiment differs from that according to the fourth embodiment in the feature that the insulating resin layer 30 is provided on not only the semiconductor device mounting regions but also the entire one side of the substrate 111. The other structural components in the fifth embodiment are similar to those in the fourth embodiment, and the repeated description of the same structural components as those in the fourth embodiment is omitted as appropriate.

In the semiconductor module according to the fifth embodiment, the insulating resin layer 30 is provided on not only the semiconductor device mounting regions but also the entire one side of the substrate 111, and the protective layer 131 is exposed on lateral sides of the semiconductor module 10. The bump 124 penetrate this insulating resin layer 30, and the tip portion of the bump 124 is embedded in the sealing resin 50. Similar to the fourth embodiment, the infiltration of water from the outside is suppressed by the bumps 124. In addition thereto, the insulating resin layer 30 is provided on the entire one side of the substrate 111, so that adhesion between the sealing resin 50 and the device mounting board 102 is further improved. In the method for fabricating the semiconductor modules according to the fifth embodiment, it is only necessary to laminate the insulating resin layer 30 on the entire one side of the substrate 111, in a laminating process of the insulating resin layer 30 as described in conjunction with FIG. 15B of the fourth embodiment. Thus, the process otherwise required for the positioning can be saved, so that the method for manufacturing the semiconductor modules 10 can be simplified and the manufacturing cost can be reduced.

Sixth Embodiment

Figure 21:
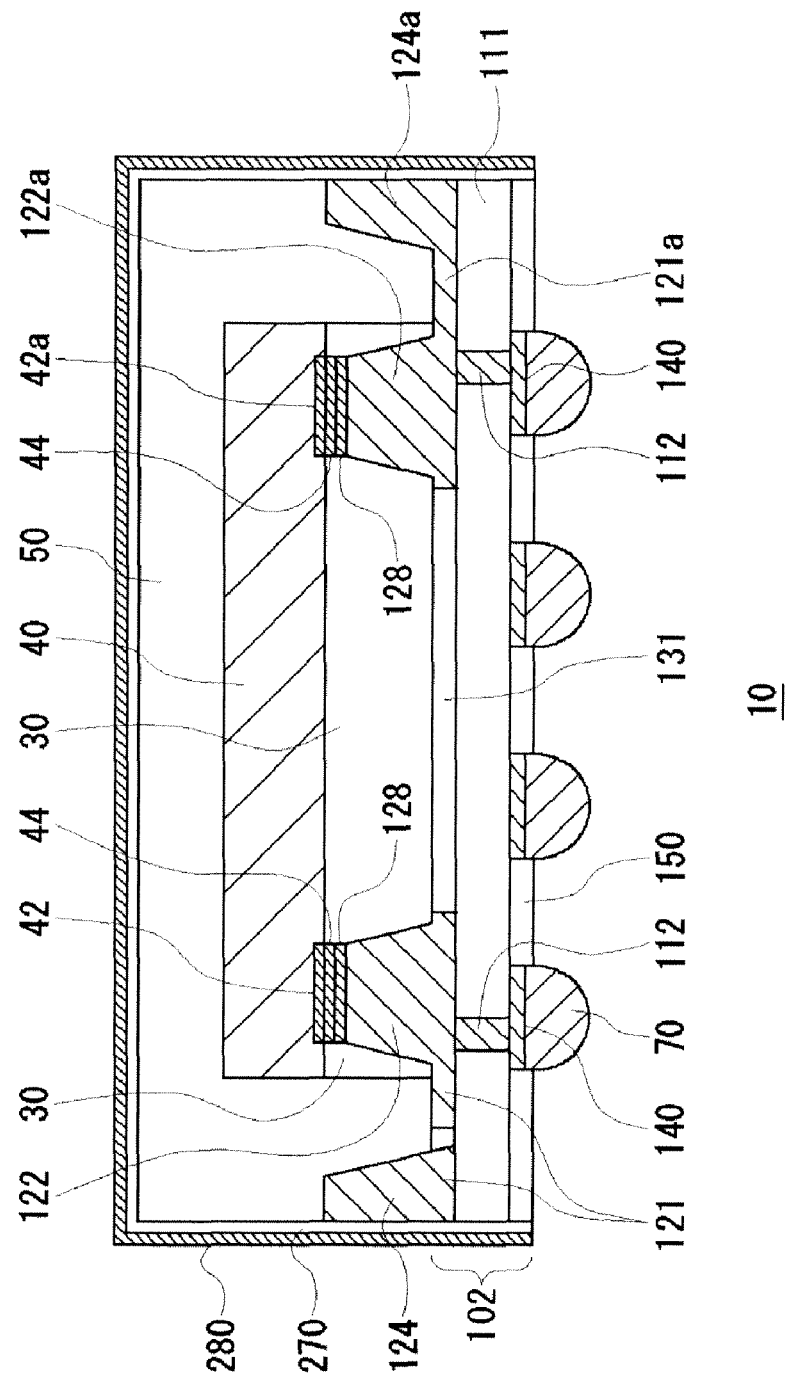
FIG. 21 is a schematic cross-sectional view showing a structure of a semiconductor module according to a sixth embodiment.

FIG. 21 is a schematic cross-sectional view showing a structure of a semiconductor module 10 according to a sixth embodiment. The semiconductor module 10 according to the sixth embodiment differs from that according to the fourth embodiment in the features that the bump 124 is exposed on a lateral side of the sealing resin 50 and that the sealing resin 50 is covered with a metallic foil 280.

More specifically, the metallic foil 280 is fixed above and on lateral sides of the sealing resin 50 through the medium of an electrically conductive adhesive 270. The metallic foil 280 is preferably aluminum foil of 15 to 50 μm in thickness. The metallic foil 280 is electrically connected to a bump 124a on a lateral side of the sealing resin 50. This bump 124a is electrically connected to the bump electrode 122a, of the bump electrodes 122 connected to the semiconductor device 40, which is a ground terminal, through the medium of the wiring layer 121a.

In this manner, the semiconductor device 40 is covered with the metallic foil 280 fixed to the ground potential, so that the radio interference the semiconductor device 40 receives is suppressed. Also, as compared with the conventional can encapsulation, a space (distance) between the metallic foil 280 and the sealing resin (package) 50 can be made smaller. Thus, the size of the semiconductor module 10 can be made smaller.

Also, covering the sealing resin (package) 50 with the metallic foil 280 ensures suppressing the infiltration of water from outside.

Seventh Embodiment

Figure 22:
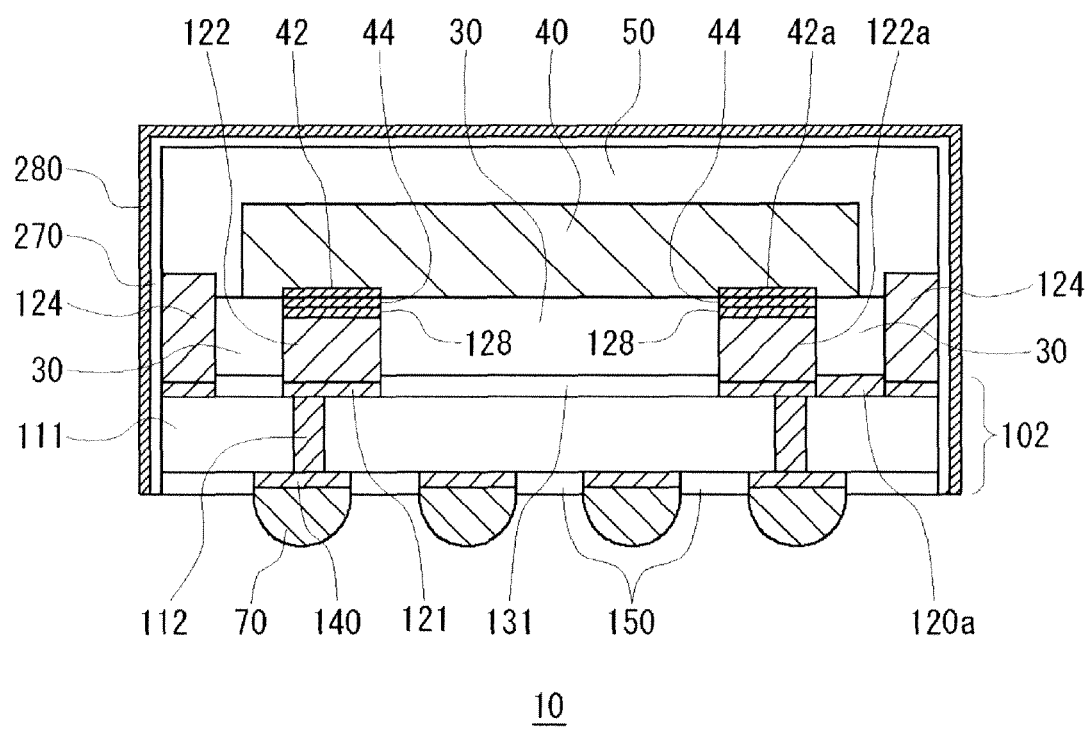
FIG. 22 is a schematic cross-sectional view showing a structure of a semiconductor module according to a seventh embodiment.

FIG. 22 is a schematic cross-sectional view showing a structure of a semiconductor module 10 according to a seventh embodiment. Similar to the fifth embodiment, in the seventh embodiment, the insulating resin layer 30 is provided on the entire one side of the substrate 111. Also, the seventh embodiment shares the feature with the sixth embodiment underlying the technical idea that the semiconductor device 40 is shielded by the metallic foil 280. However, the seventh embodiment differs from the fifth embodiment in the features that the bump 124 is exposed on a lateral side of the sealing resin 50 and that the sealing resin 50 is covered with a metallic foil 280.

According to the seventh embodiment, the semiconductor device 40 is covered with the metallic foil 280 fixed to the ground potential, so that the radio interference the semiconductor device 40 receives is suppressed. Also, as compared with the conventional can encapsulation, a space (distance) between the metallic foil 280 and the sealing resin (package) 50 can be made smaller. Thus, the size of the semiconductor module 10 can be made smaller.

Eighth Embodiment

Figure 23:
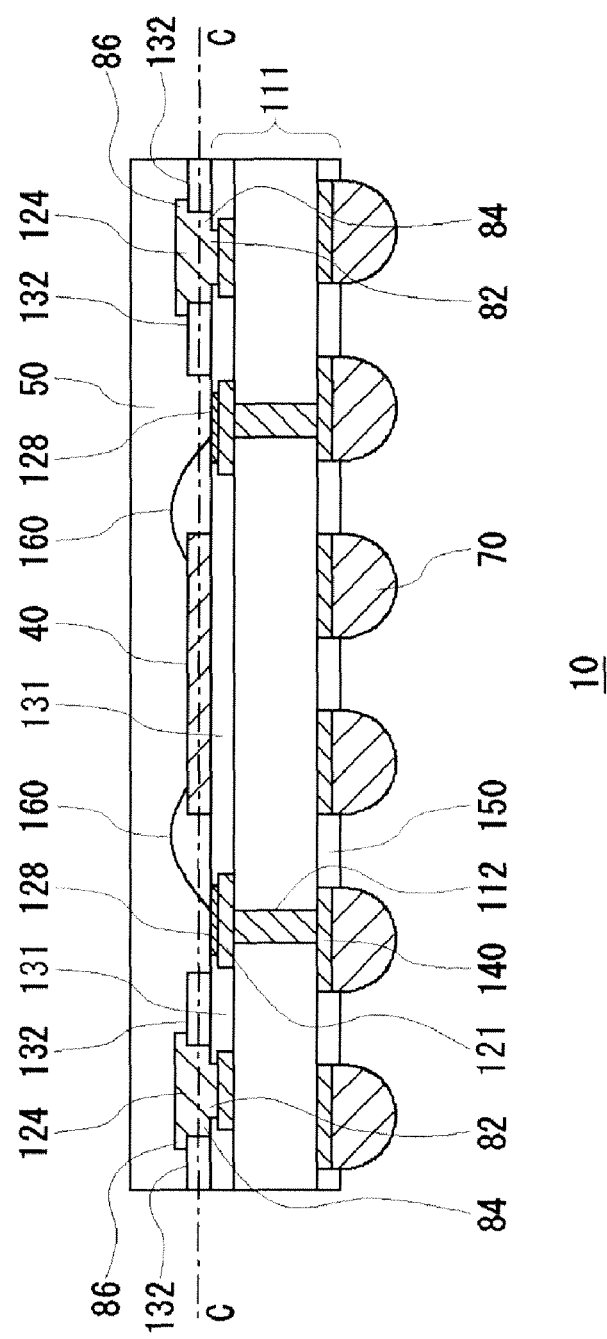
FIG. 23 is a schematic cross-sectional view showing a structure of a semiconductor module according to an eighth embodiment.
Figure 24:
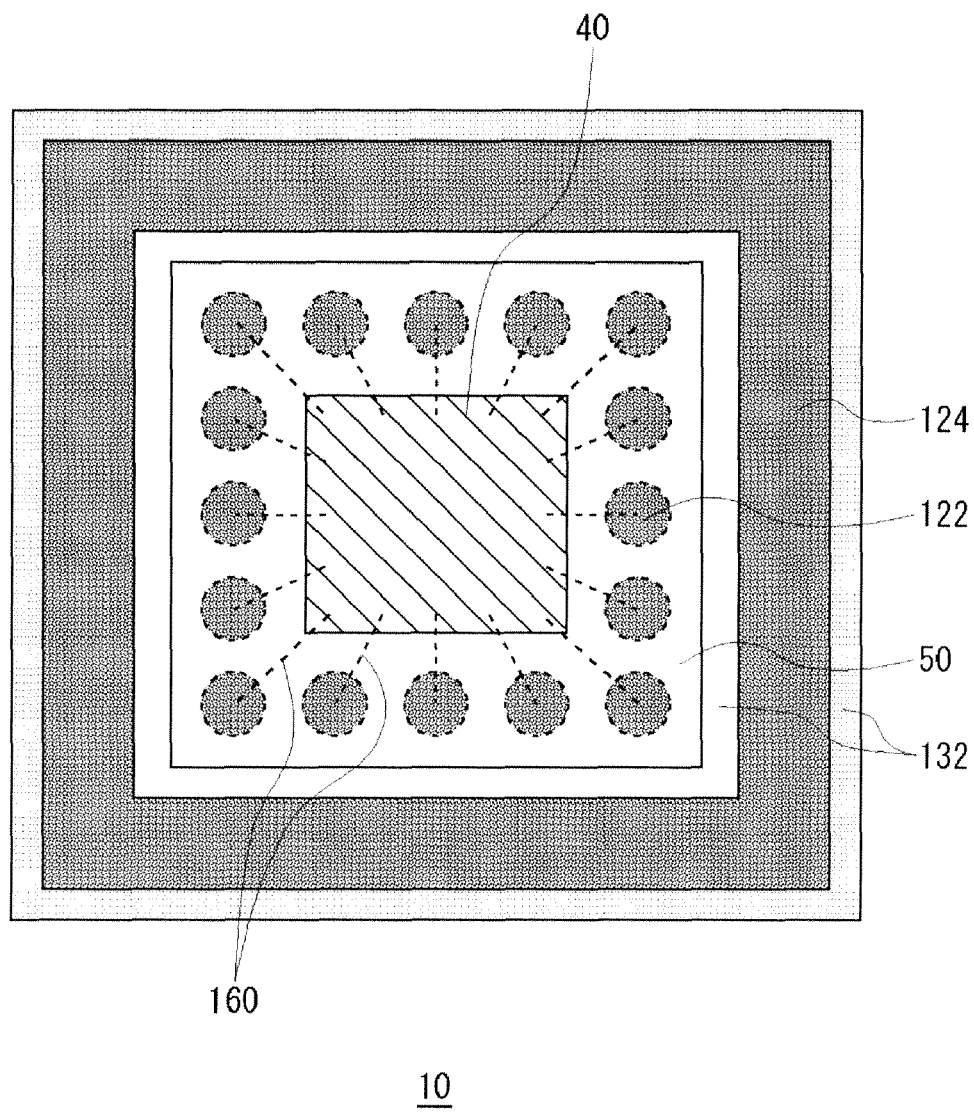
FIG. 24 shows a planar arrangement of bumps that constitute a semiconductor module according to an eighth embodiment and FIG. 24 is a plain view showing a cross section taken along the line C-C of FIG. 23.

FIG. 23 is a schematic diagram showing a structure of a semiconductor module 10 according to an eighth embodiment. FIG. 24 is a plain view showing a cross section taken along the line C-C of FIG. 23. The eight embodiment differs from the fourth embodiment in that the semiconductor device 40 is mounted on the substrate 111 through the wire bonding connection. Also, as will be described later, the bump 124 according to the eighth embodiment is of a structure different from that of the bump 124 described in the fourth embodiment.

More specifically, a gold plating layer 128 serving as a land is formed in a predetermined position of the wiring layer 121. The semiconductor device 40 is fixed on top of the protective layer 131 with the electrode forming surface up. A device electrode (not shown) provided in the semiconductor device 40 and the gold plating layer 128 are connected to each other by a wire bonding using a wire 160 such as a gold wire.

A protective layer 132 is further formed on top of the protective layer 131 in its opening portion thereof where the bump forming region provided on the protective layer 131 has openings. The protective layer 132 has opening portions whose diameter is larger than the diameter of opening portions in the protective layer 131.

The bump 124 is formed by (i) an embedded portion 82 which is embedded in an opening in the protective layer 131, (ii) an embedded portion 84 which is embedded in an opening in the protective layer 132, and a bump 86 protruding above the protective layer 132. The upper face of the bump 86 is located above the height of the gold plating layer 128 (wiring bonding portion) on top of the wiring layer 121.

In the structure of the semiconductor module 10 according to the eighth embodiment where the semiconductor device 40 is mounted on the substrate through the wire bonding connection, the bump 124, which is embedded in the sealing resin 50, around the semiconductor device 40, with the head portion thereof disposed toward the sealing resin 50 from a device mounting board 102 side, serves as a barrier. Thus, the infiltration of water from outside the semiconductor module 10 into the wire bonding portion on the substrate is suppressed. Hence, the connection reliability in the wiring bonding portions on the substrate can be improved.

(A Method for Fabricating Semiconductor Modules)

In the method for fabricating semiconductor modules 10 according to the eighth embodiment, the fabrication steps illustrated by FIG. 13A to FIG. 13C are identical to those of the fourth embodiment.

Subsequent to the process shown in FIG. 13C, as illustrated in FIG. 25A, a protective layer 132, formed of a photo solder resist, is formed on top of the protective layer 131 in such a manner that openings, for use in the bump forming regions, in the protective layer 131 are exposed.

Then, as illustrated in FIG. 25B, resists 300 used to protect copper-plated portions excepting the bump forming regions are formed on one side of the substrate 111. Land forming regions on the wiring layers 121 provided on one side of the substrate 111 are now covered by the resists 300.

Then, as illustrated in FIG. 25C, the openings, for use in the bump forming regions, in the protective layer 131 and the protective layer 132 are filled with copper by the plating method so as to form embedded portions before bumps are formed on top of the embedded portions by continuing the plating. Thereby, the bumps 124 are formed where the top surfaces of the bumps 124 are located above those of the land forming regions on the wiring layers 121.

Then, as illustrated in FIG. 26A, the masks 300 are removed before gold-resistant resists 310 where each pattern thereof represents the bump electrode forming regions as the openings are formed on one side of the substrate 111, using known photolithography method and etching method. The bump electrode forming region is covered with the gold-resistant resist 310.

Then, as illustrated in FIG. 26B, the gold plating layers 128 formed of Ni/Au layers are formed on the bump electrode forming regions, using the gold-resistant resists 310 as masks, by using the plating method. Thereby, the gold plating layer 128 is formed on the land forming region of the wiring layer 121.

Then, as illustrated in FIG. 26C, external electrodes of the semiconductor device 40 and the gold plating layers 128 provided on the wiring layers 121 are connected to each other by the wire bonding using a wire 160 such as a gold wire, after the gold-resistant resists 310 are removed and then the semiconductor device 40 is mounted on each device mounting region.

Figure 27A:
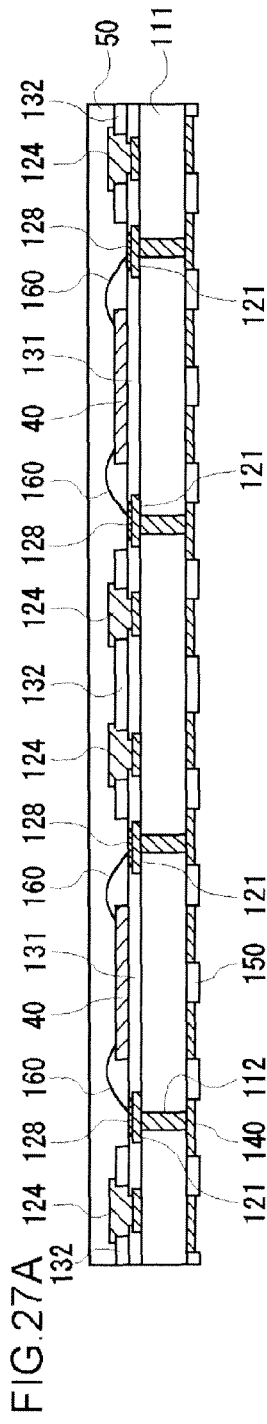
FIGS. 27A to 27C are cross-sectional views showing a process in a method for fabricating a semiconductor module according to a fifth embodiment.

Then, as illustrated in FIG. 27A, a sealing resin 50 is applied using the potting method, printing process, transfer model method or the like, so as to seal the semiconductor device 40. If there are any unwanted portions in the applied sealing resin 50, such unwanted portions will be removed with a squeegee or like means. The sealing resin 50 is thermally cured as necessary. In this process, the portions protruding in the bumps 124 are covered with the sealing resin 50. In other words, a structure is realized where the bumps 124 are embedded in the sealing resin 50.

Figure 27B:
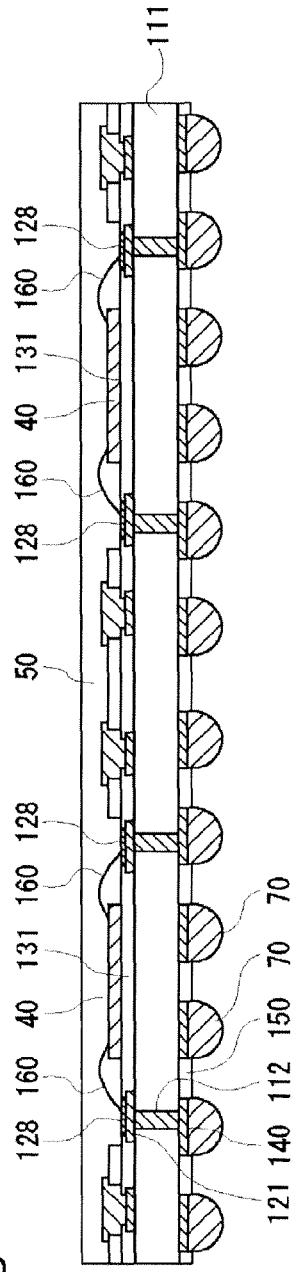

Then, as illustrated in FIG. 27B, the solder balls 70 are mounted in the openings of the protective layer 150 by using a solder mounting method. More specifically, the solder balls are mounted in such a manner that fluxes are printed in desired positions by using a screen printing method or pin transfer. Then the solder balls 70 are formed by heating the printed fluxes to a solder melting point. Through the processes performed so far, a module assembly in which semiconductor modules are integrally formed in a matrix shape is formed.

Figure 27C:
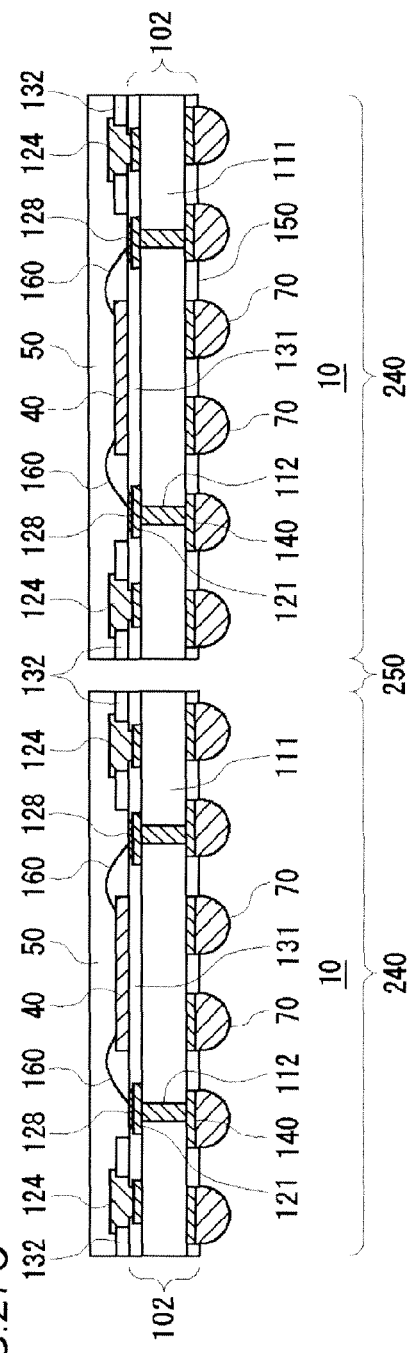

Then, as illustrated in FIG. 27C, the module assembly is divided into individual semiconductor modules 10 by dicing the module assembly along scribe lines 250 demarcating a plurality of semiconductor module forming regions 240. After that, the residues or the like resulting from the dicing are removed by performing a cleaning processing on the individualized semiconductor modules 10 using a chemical.

Through the processes as described above, the semiconductor modules 10 according to the eighth embodiment are manufactured. By employing this fabrication method, the thickness of the protective layer 132 is varied, so that the bump 124 having a desired height can be formed in a simplified and convenient manner.

It is to be noted that the bumps containing both the embedded portions embedded in the openings in the protective layer 131 and the protective layer 132 and the portions protruding above the top surfaces of the protective layer 132 around these openings are applicable to a semiconductor module where the semiconductor device 40 is mounted on the device mounting board with the electrode forming face of the semiconductor device 40 placed downward, as in the fourth to seventh embodiments.

Next, a description will be given of a mobile apparatus (portable device) provided with a semiconductor module according to the above-described embodiments. The mobile apparatus presented as an example herein is a mobile phone, but it may be any electronic apparatus, such as a personal digital assistant (PDA), a digital video cameras (DVC), a music player or a digital still camera (DSC).

Figure 28:
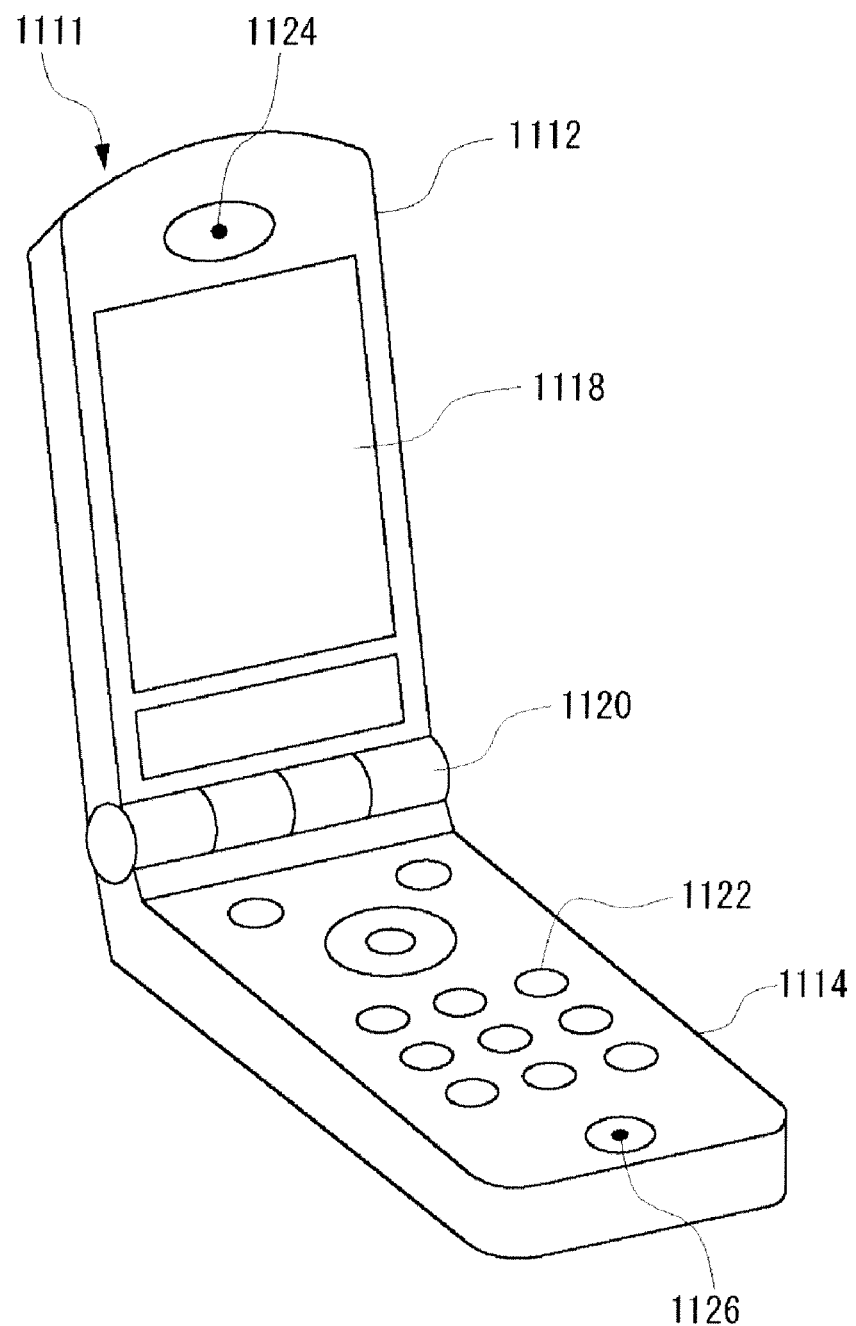
FIG. 28 shows a structure of a mobile phone provided with a semiconductor module according to an embodiment.

FIG. 28 illustrates a structure of a mobile phone provided with a semiconductor module 10 according to each of the above-described embodiments of the present invention. A mobile phone 1111 has a structure of a first casing 1112 and a second casing 1114 jointed together by a movable part 1120. The first casing 1112 and the second casing 1114 are turnable around the movable part 1120 as the axis. The first casing 1112 is provided with a display unit 1118 for displaying characters, images and other information and a speaker unit 1124. The second casing 1114 is provided with a control module 1122 with operation buttons and a microphone 1126. Note that a semiconductor module according to each embodiment of the present invention is mounted within a mobile phone 1111 such as this. The semiconductor module, according to each embodiment, mounted on a mobile phone may be used for a power supply circuit used to drive each circuit, an RF generation circuit for generating RF, a DAC, an encoder circuit, a driver circuit for a backlight used as the light source of a liquid-crystal panel used for a display of the mobile phone, and the like.

Figure 29:
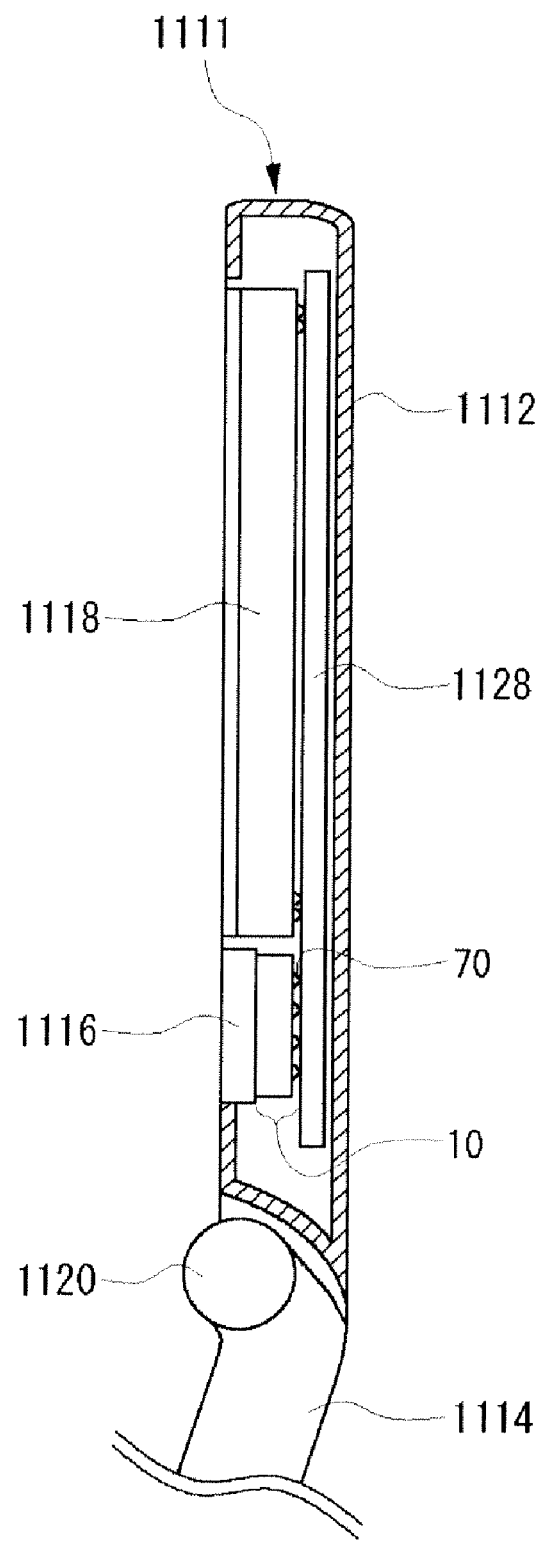
FIG. 29 is a partially schematic cross-sectional view of the mobile phone shown in FIG. 28

FIG. 29 is a partially schematic cross-sectional view (cross-sectional view of the first casing 1112) of the mobile phone shown in FIG. 28. A semiconductor module 10 according to any of the embodiments of the present invention is mounted on a printed circuit board 1128 via the solder balls 70 and is coupled electrically to a display unit 1118 and the like by way of the printed circuit board 1128. Also, a radiating substrate 1116, which may be a metallic substrate or the like, is provided on the back side of the semiconductor module 10 (opposite side of the external connection electrodes 54), so that the heat generated from the semiconductor module 10, for example, can be efficiently released outside the first casing 1112 without getting trapped therein.

According to the mobile apparatus provided with a semiconductor module according to any of the above-described embodiments of the present invention, the following advantageous effects can be achieved.

In the semiconductor module 10, the infiltration of water from outside the semiconductor module 10 is suppressed. As a result, the operation reliability of the mobile apparatus that mounts the semiconductor module 10 therein is improved.

The heat generated from the semiconductor module 10 can be efficiently released to the outside by way of the radiating substrate 1116. Thus, the rise in temperature of the semiconductor module 10 is suppressed and the heat stress between the conductive members and the wiring layers is reduced. Accordingly, as compared with a case where no radiating substrate 1116 is provided, the separation of the conductive members inside the semiconductor module from the wiring layers is prevented and therefore the reliability (heat resistance reliability) of the semiconductor module 10 is improved. As a result, the reliability (heat resistance reliability) of the mobile apparatus can be improved.

Since the semiconductor module 10 according to any of the above-described embodiments achieves reduction in size, the mobile apparatus incorporating such the semiconductor module 10 can be made thinner and smaller.

The present invention is not limited to the above-described embodiments only. It is understood that various modifications such as changes in design may be made based on the knowledge of those skilled in the art, and the embodiments added with such modifications are also within the scope of the present invention.

Though, for example, in the above-described third embodiment, the metallic foil 120 is fixed through the medium of the electrically conductive adhesive 130, the metallic foil 120 may be fixed by press bonding or static electricity.

Though, for example, in the above-described third and fourth embodiments, the metallic foil 280 is fixed through the medium of the electrically conductive adhesive 270, the metallic foil 280 may be fixed by press bonding or static electricity.

Though, in the above-described sixth and seventh embodiments, the metallic foil 280 is fixed through the medium of the electrically conductive adhesive 270, the metallic foil 280 may be fixed by press bonding or static electricity.

Also, the bump electrode 122 protruding toward the semiconductor 40 may be formed integrally with the wiring layer 121. Forming the wiring layer 121 and the bump electrode 122 integrally into a single unit improves the connection reliability between the wiring layer 121 and the bump electrode 122. In this modification, the wiring layer 121 and the bump electrode 122 are formed of a conducive material, preferably a rolled metal or more preferably a rolled copper.

DESCRIPTION OF THE REFERENCE NUMERALS

10 Semiconductor module
20 Wiring layer
22 Bump electrode
30 Insulating resin layer
40 Semiconductor device
50 Sealing resin
60 Protective layer
70 Solder ball
80 Bump
102 Device mounting board
111 Substrate
112 Via conductor
121, 140 Wiring layer
131, 150 Protective layer 122 Bump electrode
124 Bump

INDUSTRIAL APPLICABILITY

The present invention is applicable to a semiconductor module having a structure such that a semiconductor device mounted on a substrate is sealed by a sealing resin.

What is claimed is:

1. A semiconductor module, comprising:
   a wiring layer of a predetermined pattern;
   a semiconductor device mounted on said wiring layer with an insulating resin layer disposed between said semiconductor device and said wiring layer, said semiconductor device having a device electrode disposed counter to said wiring layer;
   a bump electrode, penetrating the insulating resin layer, connected to the device element wherein said bump electrode protrudes on a side of said semiconductor device from said wiring layer;
   a sealing resin for sealing said semiconductor device; and
   a bump disposed along at least one side of said semiconductor device wherein said bump protrudes on a side of said semiconductor device from said wiring layer and is embedded in said sealing resin.

2. A semiconductor module according to claim 1, wherein a head portion of said bump is located above a joint between said bump electrode and the device electrode.

3. A semiconductor module according to claim 1, wherein said bump is provided along each side of said semiconductor device.

4. A semiconductor module according to claim 1, wherein said bump and said bump electrode are formed of the same material.

5. A semiconductor module according to claim 1, wherein said bump electrode and said wiring layer are integrally formed with each other.

6. A semiconductor module according to claim 1, further comprising a metallic foil covering said sealing resin,
   wherein said metallic foil is electrically connected to a part of said bump fixed to a ground potential.

7. A semiconductor module, comprising:
   a substrate;
   a wiring layer provided on one main surface of said substrate;
   a semiconductor device mounted on said substrate with an insulating resin layer disposed between said semiconductor device and said substrate, said semiconductor device having a device electrode disposed counter to said wiring layer;
   a substrate electrode provided on said wiring layer, said substrate electrode being electrically connected to the device electrode;
   a sealing resin for sealing said semiconductor device; and
   a bump disposed along at least one side of said semiconductor device wherein said bump protrudes on a side of said semiconductor device from said wiring layer and is embedded in said sealing resin.

8. A semiconductor module according to claim 7, wherein a head portion of said bump is located above a joint between said substrate electrode and the device electrode.

9. A semiconductor module according to claim 7, wherein said bump is provided along each side of said semiconductor device.

10. A semiconductor module according to claim 7, wherein said substrate electrode protrudes on a side of said semiconductor device, and
    said substrate electrode is a bump electrode which penetrates the insulating resin layer and connects to the device electrode.

11. A semiconductor module according to claim 10, wherein said bump and said substrate electrode are formed of the same material.

12. A semiconductor module according to claim 7, further comprising a metallic foil covering said sealing resin,
    wherein said metallic foil is electrically connected to a part of said bump fixed to a ground potential.

13. A semiconductor module according to claim 7, further comprising a protective layer, provided on said substrate, having an opening in which a bump forming region is exposed,
    wherein said bump has an embedded portion embedded into the opening of said protective layer and a bump protruding above an upper face of a periphery of the opening of said protective layer.

* * * * *